US011550971B1

(12) United States Patent
Lu et al.

(10) Patent No.: US 11,550,971 B1
(45) Date of Patent: Jan. 10, 2023

(54) PHYSICS SIMULATION ON MACHINE-LEARNING ACCELERATED HARDWARE PLATFORMS

(71) Applicant: X Development LLC, Mountain View, CA (US)

(72) Inventors: Jesse Lu, Hollister, CA (US); Brian Adolf, San Mateo, CA (US); Martin Schubert, Mountain View, CA (US)

(73) Assignee: X Development LLC, Mountain View, CA (US)

( * ) Notice: Subject to any disclaimer, the term of this patent is extended or adjusted under 35 U.S.C. 154(b) by 957 days.

(21) Appl. No.: 16/251,708

(22) Filed: Jan. 18, 2019

(51) Int. Cl.
```
G06F 7/544      (2006.01)
G06F 30/20      (2020.01)
G06N 3/04       (2006.01)
G06F 17/16      (2006.01)
```

(52) U.S. Cl.
CPC ............ *G06F 30/20* (2020.01); *G06F 7/5443* (2013.01); *G06F 17/16* (2013.01); *G06N 3/04* (2013.01)

(58) Field of Classification Search
CPC ............ G06F 7/544; G06F 17/16; G06N 3/04
USPC ............................................................. 703/2
See application file for complete search history.

(56) References Cited

U.S. PATENT DOCUMENTS

| | | |
|---|---|---|
| 5,774,693 A | 6/1998 | Hsu et al. |
| 6,772,076 B2 | 8/2004 | Yamamoto et al. |
| 7,219,085 B2 | 5/2007 | Buck et al. |
| 9,589,757 B1 | 3/2017 | Hannon et al. |
| 9,697,463 B2 | 7/2017 | Ross et al. |
| 9,710,748 B2 | 7/2017 | Ross et al. |
| 9,747,546 B2 | 8/2017 | Ross et al. |
| 9,805,303 B2 | 10/2017 | Ross et al. |
| 2004/0225483 A1 | 11/2004 | Okoniewski et al. |

(Continued)

FOREIGN PATENT DOCUMENTS

| | | |
|---|---|---|
| WO | 2017/176370 A1 | 10/2017 |
| WO | 2017/223560 A1 | 12/2017 |

OTHER PUBLICATIONS

Chen, R.T. et al., "Neural Ordinary Differential Equations", 32nd Conference on Neural Information Processing Systems (NIPS 2018), Oct. 22, 2018, 18 pages.

(Continued)

*Primary Examiner* — Tan V Mai
(74) *Attorney, Agent, or Firm* — Christensen O'Connor Johnson Kindness PLLC

(57) ABSTRACT

At least one machine-accessible storage medium that provides instructions that, when executed by a machine, will cause the machine to perform operations. The operations comprise configuring a simulated environment to be representative of a physical device based, at least in part, on an initial description of the physical device that described structural parameters of the physical device. The operations further comprise performing a physics simulation with an artificial intelligence ("AI") accelerator. The AI accelerator includes a matrix multiply unit for computing convolution operations via a plurality of multiply-accumulate units. The operations further comprise computing a field response in response of the physical device in response to an excitation source within the simulated environment when performing the physics simulation. The field response is computed, at least in part, with the convolution operations to perform spatial differencing.

35 Claims, 10 Drawing Sheets

(56) References Cited

U.S. PATENT DOCUMENTS

| | | |
|---|---|---|
| 2010/0312539 A1 | 12/2010 | Yamagajo et al. |
| 2014/0365188 A1 | 12/2014 | Doerr |
| 2016/0012176 A1 | 1/2016 | Liu et al. |
| 2016/0033765 A1 | 2/2016 | Liu et al. |
| 2016/0174902 A1 | 6/2016 | Georgescu et al. |
| 2018/0018757 A1 | 1/2018 | Suzuki |
| 2018/0045953 A1 | 2/2018 | Fan et al. |
| 2018/0322390 A1 | 11/2018 | Das et al. |
| 2022/0253685 A1* | 8/2022 | Ozcan ............... G06N 3/067 |

OTHER PUBLICATIONS

Petykiewicz, J. et al., "Active Nanophotonics: Inverse Design and Strained Germanium Light Emitters", A Dissertation Submitted to the Department of Electrical Engineering and the Committee on Graduate Studies of Stanford University, Oct. 2016. 134 pages.

Ying-Shou Lu, J., "Nanophotonic Computational Design", A Dissertation Submitted to the Department of Electrical Engineering and the Committee on Graduate Studies of Stanford University, Jun. 2013, 122 pages.

Piggott, A.Y., "Automated Design of Photonic Devices", A Dissertation Submitted to the Department of Electrical Engineering and the Committee on Graduate Studies of Stanford University, Jun. 2018, 112 pages.

Lu, J. et al., "Nanophotonic Computational Design", Optics Express, vol. 21, No. 11, Jun. 3, 2013, 17 pages.

Piggott, A. Y. et al., "Inverse Design and Implementation of a Wavelength Demultiplexing Grating Coupler", Scientific Reports, Nov. 27, 2014, 5 pages.

Piggott, A.Y. et al., "Inverse Design and Demonstration of a Compact and Broadband On-Chip Wavelength Demultiplexer", Nature Photonics, May 11, 2015, 5 pages.

Piggott, A.Y. et al., "Silicon Photonics: Design Approach to Integrated Photonics Explores Entire Space of Fabricable Devices", Laser Focus World, Aug. 13, 2018, 5 pages.

Piggott, A. Y. et al., "Fabrication-constrained Nanophotonic Inverse Design", Scientific Reports, May 11, 2017, 7 pages.

Su, L. et al., "Inverse Design and Demonstration of a Concept On-Chip Narrowband Three-Channel Wavelength Demultiplexer", ACS Photonics, Aug. 17, 2017, 6 pages.

Su, L. et al., Fully-Automated Optimization of Grating Couplers', Optics Express, vol. 26, No. 4m Feb. 2018, 12 pages.

Robinson, J.T., "First-Principle Derivation of Gain in High-Index-Contrast Waveguides", Optics Express, vol. 16, No. 21, Oct. 13, 2008, 11 pages.

Lalau-Keraly, C.M. et al., "Adjoint Shape Optimization Applied to Electromagnetic Design", Optical Society of America, 2013, 9 pages.

Georgakopoulos, S.V. et al., "Higher-Order Finite-Fifference Schemes for Electromagnetic Radiation, Scattering, and Penetration .1. Theory", IEEE Antennas and Propagation Magazine, vol. 44, Issue: 1, Feb. 2002, 9 pages.

Alwani, M. et al., "Fused-Layer CNN Accelerators", 49th Annual IEEE/ACM International Symposium on Microarchitecture (MICRO), Oct. 2016, 12 pages.

Stanford, K. et al., "Design Analysis of a Hardware CNN Accelerator", 2017, 8 pages.

Han, S. et al., "DSD: Dense-Sparse-Dense Training for Deep Neural Networks", arXiv:1607.04381 [cs.CV], 2017, 13 pages.

Jouppi, N. et al., "In-Datacenter Performance Analysis of a Tensor Processing Unit", 44th International Symposium on Computer Architecture, Jun. 26, 2017, 17 pages.

Markidis, S. et al., "NVIDIA Tensor Core Programmability Performance & Precision", arXiv:1803.04014 [cs.DC], Mar. 2018, 12 pages.

Chen, Yu-Hsin et al., "Eyeriss: A Spatial Architecture for Energy-Efficient Dataflow for Convolutional Neural Networks", 2016 ACM/IEEE 43rd Annual International Symposium on Computer Architecture (ISCA), Jun. 2016, 13 pages.

Sze, V. et al., "Efficient Processing of Deep Neural Networks: A Tutorial and Survey", arXiv:1703.09039 [cs.CV], Aug. 2017, 35 pages.

Du, Li et al., "Hardware Accelerator Design for Machine Learning", Machine Learning—Advanced Techniques and Emerging Applications, 2018, 14 pages.

AI accelerator—Wikipedia, retrieved from internet: <https://en.wikipedia.org/wiki/AI_accelerator>, Jan. 3, 2019, 9 pages.

Sato, K. et al., "An In-Depth Look at Google's First Tensor Processing Unti (TPU)", Retreived from internet <https://cloud.google.com/blog/products/gcp/an-in-depth-look-at-googles-first-tensor-processing-unit-tpu> Dec. 21, 2018, 19 pages.

Dean, J. et al., "Build and Train Machine Learning Models on our New Google Cloud TPUs", Retreived from internet <https://blog.google/products/google-cloud/google-cloud-offer-tpus-machine-learning/> Dec. 21, 2018, 6 pages.

"Cloud Tensor Processing Units (TPUs)", Retrieved from internet <https://cloud.google.com/tpu/docs/tpus> Dec. 21, 2018, 7 pages.

"CS231 in Convolutional Neural Networks for Visual Recognition", Retrieved from internet <http://cs231n.github.io/convolutional-networks/> Jan. 2, 2019, 23 pages.

Performance Guide, Cloud TPU, Google Cloud, Retrieved from internet <https://cloud.google.com/tpu/docs/performance-guide> Jan. 2, 2019, 8 pages.

System Architecture, Cloud TPU, Google Cloud, Retrieved from internet <https://cloud.google.com/tpu/docs/system-architecture> Dec. 21, 2018, 6 pages.

Paquim, A., "What's Inside a TPU", Retrieved from internet <https://medium.com/@antonpaquin/whats-inside-a-tpu-c013eb51973e> Jan. 2, 2019, 24 pages.

Wilson, J. et al., "An Accurate and Stable Fourth Order Finite Difference Time Domain Method", 2008 IEEE MTT-S International Microwave Symposium Digest, Jun. 2008, 4 pages.

Zeiler, M. et al., "Visualizing and Understanding Convolutional Networks", arXiv:1311.2901 [cs.CV], Nov. 2013, 16 pages.

Taflove, Allen, "Computational Electrodynamics The Finite-Difference Time-Domain Method", Chapters 1 and 2, Artech House, Inc., 1998, 121 pages.

Taflove, Allen et al., "Computational Electrodynamics The Finite-Difference Time-Domain Method", Third Edition, Chapter 20, Artech House, Inc., 2005. 41 pages.

* cited by examiner

PHYSICS SIMULATION ON MACHINE-LEARNING ACCELERATED HARDWARE PLATFORMS

TECHNICAL FIELD

This disclosure relates generally to design tools, and in particular but not exclusively, relates to design tools for electromagnetic and acoustic devices.

BACKGROUND INFORMATION

Electromagnetic devices (e.g., optical devices, electrical devices, or otherwise) are devices that generate, manipulate, propagate, and/or measure electromagnetic radiation. Their applications vary broadly and include, but are not limited to, acousto-optic modulators, optical modulators, optical ring resonators, distributed Bragg reflectors, lasers, lenses, transistors, waveguides, antennas, and the like. Conventional techniques for the design of these devices are sometimes determined through a simple guess and check method in which a small number of design parameters of a pre-determined design are adjusted for suitability to a particular application. However, in actually, these devices may have design parameters ranging from hundreds all the way to many billions, dependent on the device size and functionality.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described.

DETAILED DESCRIPTION

Embodiments of an apparatus, system, and method for performing physics simulation on machine-learning accelerated hardware platforms are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

A deep neural network is a type of machine learning algorithm modeled loosely after the human brain. More specifically, a deep neural network provides an output in response to receiving an input; the output being dependent on the task the neural network was trained to perform. For example, a trained deep neural network may receive an image (e.g., of a cat), perform inference calculations, and subsequently output a value (e.g., probabilistic certainty) classifying the contents of the image (e.g., a confidence level that the image contains a cat). More generally, advances in neural networks have helped computer systems progress in performing complex tasks such as object recognition, machine translation, autonomous driving, among many others.

Recent advances in machine learning, as described above, have ignited a race to design custom hardware (e.g., AI accelerators) that can excel at training and inference calculations for neural networks. More specifically, AI accelerators are optimized to perform matrix multiplication or convolution operations at increased speeds and efficiency relative to conventional central processing units and graphics processing units. Described herein are embodiments that utilize AI accelerators to perform physics simulations. In some embodiments, the physics simulations are incorporated in an inverse design tool that models the underlying physics governing operation of physical devices for optimizing the structure of the physical device based on a target performance and/or functionality. Advantageously, the physics simulations are redefined to appear as inference or training problems of a neural network, such that the AI accelerator may be utilized to realize the benefits of increase computational domain size and/or reduced time cost.

Figure 1:
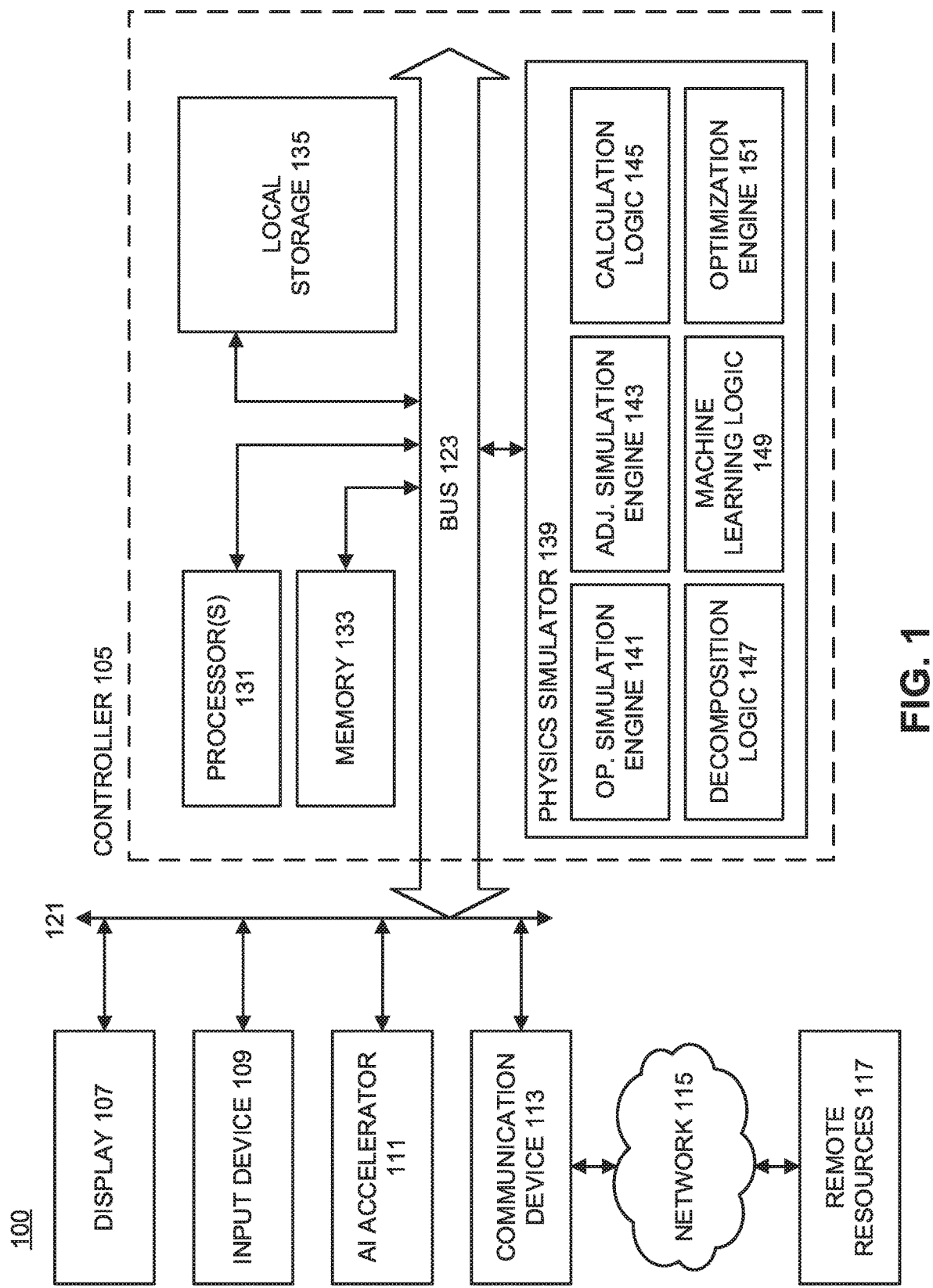
FIG. 1 is a functional block diagram illustrating a system for optimizing structural parameters of a physical device via physics simulations using an AI accelerator, in accordance with an embodiment of the present disclosure.

FIG. 1A is a functional block diagram illustrating a system 100 for optimizing structural parameters of a physical device via physics simulations using an AI accelerator, in accordance with an embodiment of the present disclosure. In the following embodiments, system 100 will be described in context of a physical device operating in an electromagnetic domain (e.g., an optical device). However, it is appreciated that the physical device is not limited to the electromagnetic domain. Rather, system 100 provides first-principles based design and optimization of physical devices based on the optical, electrical, magnetic, acoustic, quantum, and/or fluidic response (e.g., field response) to a physical stimuli (e.g., excitation source) determined via physics simulations using machine learning accelerated hardware (e.g., AI accelerator). In other words, it is appreciated that system 100 is not limited to modeling operation of optical devices in an electromagnetic domain, and that other physical devices operating in different physical domains (e.g., acoustic, quantum, capacitive, vibrational, or otherwise) may also be modeled and subsequently have their structural parameters optimized.

As illustrated, system 100 includes controller 105, display 107, input device(s) 109, artificial intelligence (AI) accelerator 111, communication device(s) 113, network 115, remote resources 117, and bus 121. Controller 105 includes bus 123, processor(s) 131, memory 133, local storage 135, and physics simulator 139. Physics simulator 139 includes operational simulation engine 141, adjoint simulation engine 143, calculation logic 145, decomposition logic 147, machine learning logic 149, and optimization engine 151. It is appreciated that in some embodiments, controller 105 may be a distributed system.

Controller 105 is coupled to display 107 (e.g., a light emitting diode display, a liquid crystal display, and the like) via bus 123 through bus 121 for displaying information to a user utilizing system 100 to optimize structural parameters of the physical device. Input device 109 is coupled to bus 121 through bus 123 for communicating information and command selections to processor 131. Input device 109 may include a mouse, trackball, keyboard, stylus, or other computer peripheral, to facilitate an interaction between the user and controller 105. In response, controller 105 may provide verification of the interaction through display 107. Additionally, controller 105 is coupled to AI accelerator 111 through bus 121 and bus 123. AI accelerator 111 is a processing system designed to provide hardware acceleration of artificial intelligence applications (e.g., training and inference calculations of neural networks).

Another device, which may optionally be coupled to controller 105, is a communication device 113 for accessing remote resources 117 of a distributed system via network 115. Communication device 113 may include any of a number of networking peripheral devices such as those used for coupling to an Ethernet, Internet, wide area network, and the like. Communication device 113 may further include a mechanism that provides connectivity between controller 105 and the outside world. The remote resources 115 may be part of a distributed system and include any number of processors, memory, and other resources for optimizing the structural parameters of the physical device. In some embodiments, remote resources 117 may include an AI accelerator similar to AI accelerator 111. In the same or other embodiments, communication device 113 may be utilized via controller 105 for accessing AI accelerator 111. Additionally, it is noted that any or all of the components of system 100 illustrated in FIG. 1 and associated hardware may be used in various embodiments of the present disclosure.

Controller 105 orchestrates operation of system 100 for optimizing structural parameters of the physical device via physics simulations using AI accelerator 111. More specifically, controller 105 generates instructions that may be passed to or requested by AI accelerator 111 that correspond to physics simulations masked to appear as inference or training operations of a neural network to take advantage of the increased computational speed provided by AI accelerator 111. The instructions are generated via the various components of controller 105, which includes processor 131 (e.g., one or more central processing units, graphics processing units, and/or tensor processing units, etc.), memory 133 (e.g., volatile memory such as DRAM and SRAM, non-volatile memory such as ROM, flash memory, and the like), storage 135 (e.g., magnetic memory such as computer disk drives, solid state drives, and the like), and physics simulator 139 coupled to one another through bus 123.

Controller 105 includes software (e.g., instructions included in memory 133 coupled to processor 131) and/or hardware logic (e.g., application specific integrated circuits, field-programmable gate arrays, and the like) that when executed by controller 105 cause controller 105, AI accelerator 111, or system 100 to perform operations. The operations may be based on instructions stored within any one of, or a combination of, AI accelerator 111, memory 133, local storage 135, physics simulator 139, and remote resources 117 accessed through network 115.

In the illustrated embodiment, modules 141-151 of physics simulator 139 are utilized to optimize structural parameters of physical devices (e.g., an optical device operating within an electromagnetic domain) via physics simulations for first principles based design. Specific computations for performing the physics simulations (e.g., spatial differencing) may be accelerated by AI accelerator 111 with instructions generated by the various modules of physics simulator 139. In some embodiments, system 100 may optimize structural parameters of an optical device via, inter alia, simulations (e.g., operational and adjoint simulations) that utilize a finite-difference time-domain (FDTD) method or similar techniques to discretize the underlying equations (e.g., Faraday's law and Ampere's law) governing the physics of the device. The described techniques are then used to perform physics simulations to model a field response (e.g., electric and magnetic fields) to an excitation source with respect to time to ultimately determine how structure (e.g., structural parameters of the physical device) influences performance. The operational simulation engine 141 provides instructions for performing a simulation of the physical device operating in response to an excitation source (e.g., an electromagnetic wave with a specified spatial profile, phase, and the like) within a simulated environment. Adjoint simulation engine 143 is utilized to perform an adjoint simulation corresponding to a time backwards simulation in which a loss value related to a performance metric of the physical device is backpropagated through the simulated environment to determine how the structure of the physical device influences performance. Calculation logic 145 computes a loss value or metric of the physical device based, at least in part, on a performance metric of the physical device. In one embodiment, the loss value or metric is associated with a comparison (e.g., a difference) between a performance metric determined from the operational simulation and a target performance. In some embodiments, calculation logic 145 is also utilized to determine a structural gradient (e.g., how changes in the structural parameters influence or change the loss metric) based, at least in part, on field gradients determined from the operational simulation and loss gradients determined from the adjoint simulation. Decomposition logic 147 facilitates the performance of a variety of tasks, such as extracting decomposition components from the field response to reduce a dimensionality of the field response, subsampling computations into smaller problems, and the like. In other words, decomposition logic 147 includes instructions for reducing the computational burden of the simulation due to the large state sizes (e.g., caused by the number of voxels and/or time steps). Machine learning (ML) logic 149 is utilized to interface with AI accelerator 111 such that proper instructions may be provided to take advantage of the specialized hardware of the AI accelerator 111. Furthermore, ML logic 149 may include various frameworks (e.g., TensorFlow developed by Google) to provide a high level instruction set that may be interpreted by AI accelerator 111. Optimization logic 151 is utilized to update the structural parameters of the physical device to reduce the loss value and generate a revised description of the physical device.

Figure 2:
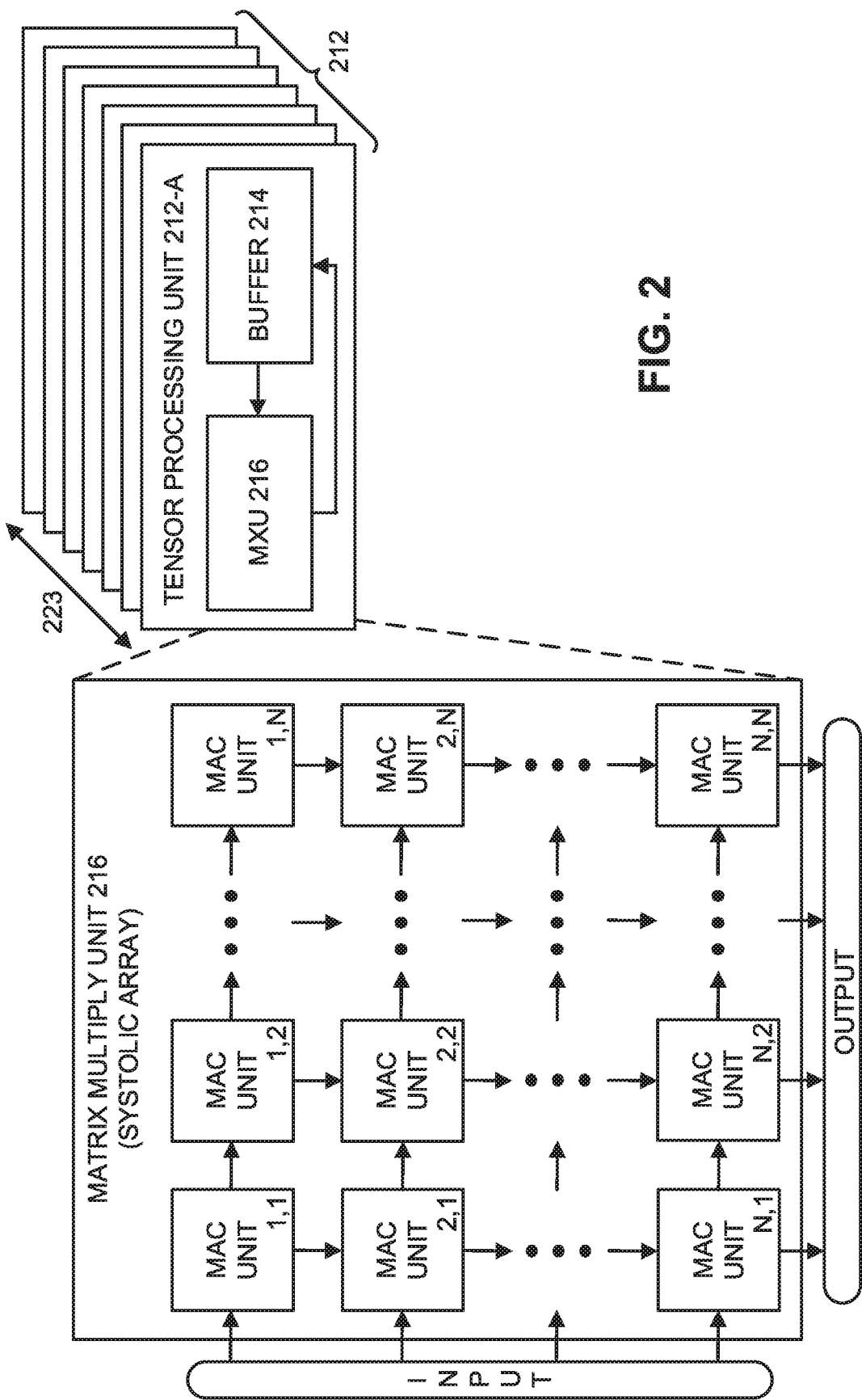
FIG. 2 illustrates an example AI accelerator used for physics simulations, in accordance with an embodiment of the present disclosure.

FIG. 2 illustrates an example AI accelerator 211 used for physics simulations, in accordance with an embodiment of the present disclosure. AI accelerator 211 is one possible implementation of AI accelerator 111 illustrated in FIG. 1. Referring back to FIG. 2, AI accelerator 211 is a machine-learning accelerated hardware platform optimized for artificial intelligence (e.g., machine learning) applications. Specifically, AI accelerator 211 is structured as a coprocessor to accelerate the various matrix multiplication operations (e.g., convolution operations) necessary for neural network training and inference. In some embodiments, AI accelerator 211 is designed to receive (or request) instructions initially provided in a given machine learning framework (e.g., TensorFlow developed by Google) that is subsequently translated into instructions executable by AI accelerator 211 and its various components.

In the illustrated embodiment, AI accelerator 211 is a distributed processing platform including a plurality of tensor processing units (TPUs) 212 interconnected with one another by bus 223. Each of the TPUs 212 may individually be considered a machine learning accelerator, that when coupled together, form a distributed system that scales computational speed (e.g., linearly) with respect to the number of TPUs within AI accelerator 211. Each of the plurality of TPUs 212 includes, inter alia, a buffer 214 and a matrix multiply unit (MXU) 216. The buffer 214 provides a storage medium (e.g., memory) for storing instructions (e.g., inputs) and outputs (e.g., result of matrix multiplication or convolution operations). The matrix multiply unit 216 includes a plurality of multiply-accumulate (MAC) units. Each MAC unit is a hardware unit that performs a multiply-accumulate operation (or fused multiply-accumulate operation), which computes the product of two numbers and adds that product to an accumulator. The precision of such operations are dependent on system design, but may include eight-bit integer multipliers, sixteen-bit floating-point multipliers, and the like. In one embodiment, each of the MAC units can perform eight-bit multiply-accumulate operations. In the illustrated embodiment, the MAC units of each of the MXUs 216 are arranged in N rows by N columns to form a systolic array. Each column of the systolic array produces a partial product (e.g., of a matrix multiply or convolution operation) that may be summed to determine the result of the matrix multiplication or convolution operation. Thus, through the MXUs 216 of the plurality of TPUs 212 the AI accelerator 211 may be able to provide hardware acceleration of the matrix multiplication or convolution operations that make up the bulk of the computational costs of neural networks.

Advantageously, embodiments described herein leverage the computational power of AI accelerator 211 to perform physics simulations for optimizing a design of a physical device. More specifically, the physics simulations are masked or otherwise redefined to look like (e.g., to AI accelerator 211) training a convolutional neural network (for example), which allows for leveraging the hardware acceleration provided by AI accelerator 211.

Figure 3A:
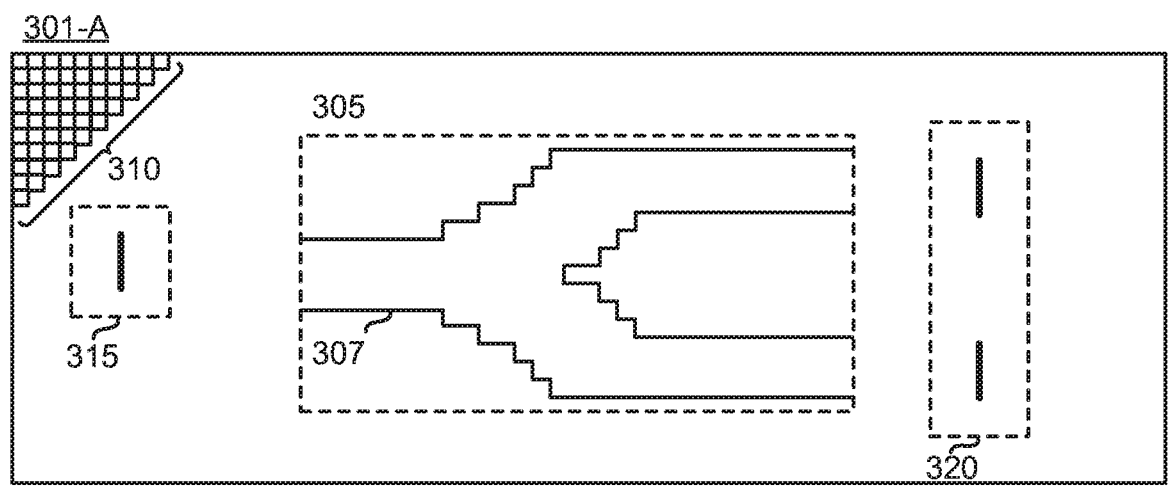
FIG. 3A illustrates a demonstrative simulated environment describing a physical device, in accordance with an embodiment of the present disclosure.
Figure 3B:
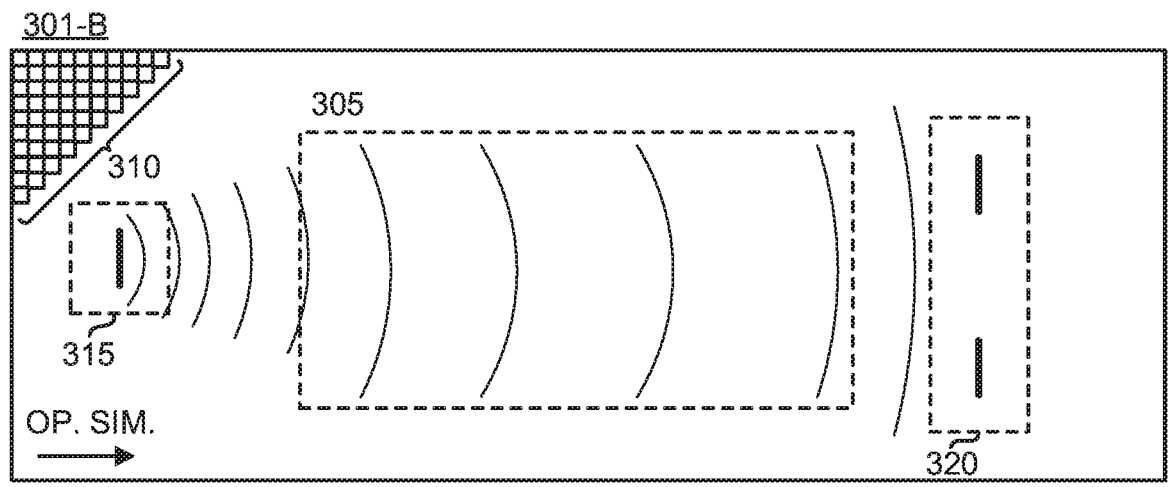
FIG. 3B illustrates an example operational simulation describing a physical device, in accordance with an embodiment of the present disclosure.
Figure 3C:
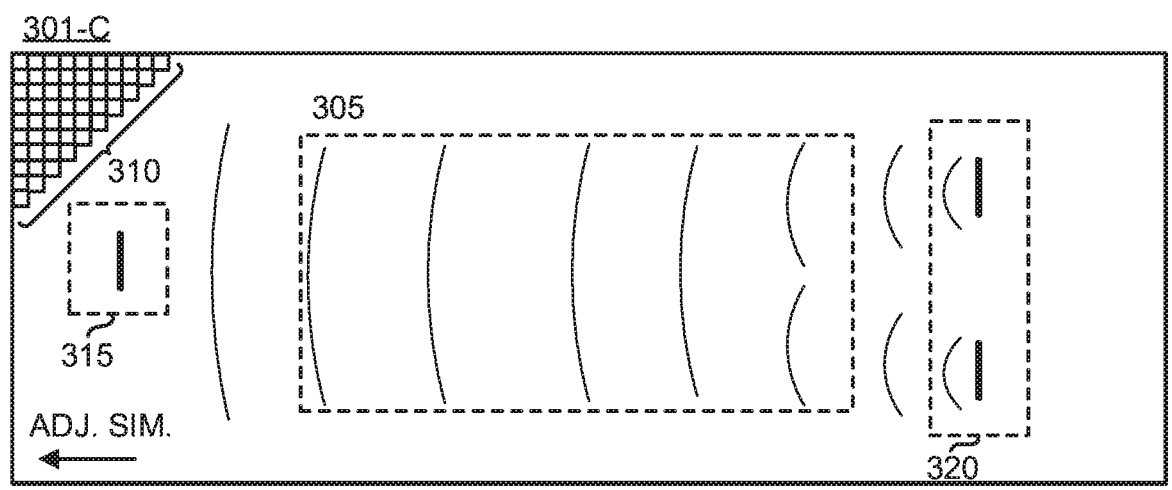
FIG. 3C illustrates an example adjoint simulation within the simulated environment by backpropagating a loss value, in accordance with an embodiment of the present disclosure.

FIGS. 3A-3C respectively illustrate an initial set up of a simulated environment 301-A describing a physical device, performing an operational simulation of the physical device operating in response to an excitation source within the simulated environment 301-B, and performing an adjoint simulation of the physical device within the simulated environment 301-C. The initial set up of the simulated environment 301, operational simulation of the physical device, and adjoint simulation of the physical device may be implemented with system 100 illustrated in FIG. 1. As illustrated in FIGS. 3A-3C, simulated environment 301 is represented in two-dimensions. However, it is appreciated that higher (e.g., 3-dimensional space) and lower (e.g., 1-dimensional space) dimensionality may also be used to describe simulated environment 301 and the physical device. In some embodiments, optimization of structural parameters of the physical device illustrated in FIGS. 3A-3C may be achieved via, inter alia, physics simulations (e.g. operational and adjoint simulations) that utilize a finite-difference time-domain (FDTD) method to model the field response (e.g., electric and magnetic fields) to an excitation source. The physics simulations may be performed, at least in part, via a machine learning accelerated hardware platform (e.g., AI accelerator 211 illustrated in FIG. 2).

FIG. 3A illustrates a demonstrative simulated environment 301-A describing an optical device (i.e., a physical device), in accordance with an embodiment of the present disclosure. More specifically, in response to receiving an initial description of a physical device defined by one or more structural parameters (e.g., an input design), a system (e.g., system 100 of FIG. 1) configures a simulated environment 301 to be representative of the physical device. As illustrated, the simulated environment 301 (and subsequently the physical device) is described by a plurality of voxels 310, which represent individual elements (i.e., discretized) of the two-dimensional (or other dimensionality) space. Each of the voxels 310 is illustrated as two-dimensional squares. However, it is appreciated that in other embodiments the voxels may be represented with different dimensionality or shape, which may be dependent on the underlying dimensionality of simulated environment 301 and/or the physical device. In one embodiment, simulated environment 301 is described within three-dimensional space to optimize a physical device having a three-dimensional structure. In the same embodiment, the plurality of voxels 310 may be represented as cubes or other shapes in three-dimensional space. Thus, it is appreciated that the specific shape and dimensionality of the plurality of voxels 310 may be adjusted dependent on simulated environment 301 and the physical device being simulated. It is further noted that only a portion of the plurality of voxels 310 are illustrated to avoid obscuring other aspects of simulated environment 301.

Each of the plurality of voxels 310 may be associated with a structural value, a field value, and a source value, which collectively and respectively describe the structural parameters, field response, and excitation source. More specifically, the structural values of the simulated environment 301 describe the structural parameters (e.g., design) of the physical device. In one embodiment, the initial design of the physical device may be random such that there is essentially no initial design of the physical device. In one embodiment, this may be achieved via a randomized structural value for each of the physical voxels. The structural value represents a physical property or parameter that interacts with the excitation source or is otherwise related to physical domain in which the physical device operates. In one embodiment, the structural values may correspond to relative permittivity, permeability, and/or refractive index that collectively describe structural (i.e., material) boundaries of the physical device. For example, interface 307 is representative of where relative permittivity changes within the simulated environment 301 and may define a boundary of the physical device where a first material meets or otherwise interfaces with a second material. The field values of the plurality of voxels describe the field (or loss) response that is calculated (e.g., via Maxwell's equations) in response to an excitation source described by source value(s). The field response, for example, may correspond to a collection of vectors (i.e., a tensor) describing the electric and/or magnetic fields (e.g., in one or more orthogonal directions) at a particular time step for each of the plurality of voxels 310. More specifically, individual vectors may correspond to a Yee lattice to discretize Maxwell's equations and generate FDTD update operations for calculating the field response with respect to time in response to the excitation source. Such computations may be offloaded onto an AI accelerator (e.g., AI accelerator 211 illustrated in FIG. 2) as described in embodiments of the present disclosure.

In the illustrated embodiment, the physical device corresponds to an optical device having a design region 305, in which structural parameters of the physical device may be updated. The simulated environment 301 may include an input region 315 (e.g., input port) of the physical device corresponding to an origination location of the excitation source (e.g., a Gaussian pulse, a wave, a waveguide mode response, and the like). The excitation source may interact with the physical device based on the structural parameters (e.g., an electromagnetic wave that may be perturbed, retransmitted, attenuated, refracted, reflected, diffracted, scattered, absorbed, amplified, or otherwise influences as the wave propagates through the physical device). In other words, the excitation source causes the field response of the physical device to change, which is dependent on the underlying physics governing the physical domain and the structural parameters of the physical device. The excitation source originates at input region 315 and is positioned to propagate (or otherwise influence the field values of the plurality of voxels 310) through the simulated environment 301 (e.g., through the design region 305 and towards output region 320). In some embodiments, output region 320 corresponds to one or more output ports of the optical device. In the illustrated embodiment, the input region 315 and output region 320 are positioned outside of the design region 305. In other words, in the illustrated embodiment, only a portion of the structural parameters of the physical device is optimizable. However, in other embodiments, the entirety of the physical device may be placed within the design region 305 such that the structural parameters may represent any portion or the entirety of the design of the physical device. The electric and magnetic fields within the simulated environment 301 (and subsequently the physical device) may change (e.g., represented by field values of the individual voxels that collectively correspond to the field response of the simulated environment 301) in response to the excitation source. The output region 320 of the optical device may be used for determining a performance metric of the physical device in response to the excitation source (e.g., power, waveguide mode, etc.). The initial description of the physical device, including initial structural parameters, physical stimuli, performance parameters or metrics, and other parameters describing the physical device, are received by the system (e.g., system 100 of FIG. 1) and used to configure the simulated environment 301 for performing a first-principles based simulation of the physical device. These specific initial values and parameters may be defined directly by a user (e.g., of system 100 in FIG. 1), indirectly (e.g., via controller 105 culling pre-determined values stored in memory 133, storage 135, or remote resources 115 of FIG. 1), or a combination thereof.

FIG. 3B illustrates an operational simulation of the physical device in response to an excitation source within simulated environment 301-B, in accordance with an embodiment of the present disclosure. In the illustrated embodiment, the physical device is an optical device operating at one or more frequencies of interest and having one or more particular waveguide modes (e.g., transverse electric mode, transverse magnetic mode, or transverse electric and magnetic mode). The excitation source originates at an input region 215 (e.g. an input port) having specified spatial, phase, and/or temporal profiles. The operational simulation occurs over a plurality of time steps, including the illustrated time step. When performing the operational simulation, changes to the field response (e.g., the field value) for each of the plurality of voxels 310 are incrementally updated in response to the excitation source over the plurality of time steps. The changes in the field response at a particular time step are based, at least in part, on the structural parameters, the excitation source, and the field response of the simulated environment at the immediately prior time step included in the plurality of time steps. Similarly, in some embodiments the source value of the plurality of voxels is updated (e.g., based on the spatial profile and/or temporal profile describing the physical stimuli). It is appreciated that the operational simulation is incremental and that the field values (and source values) of the simulated environment 301 are updated incrementally at each time step as time moves forward for each of the plurality of time steps during the operational simulation. The operational simulation of the physical device may be performed with the physics simulation (e.g., via AI accelerator 211 illustrated in FIG. 2) to compute the field response for determining a performance metric of the physical device. It is further noted that in some embodiments, the update is an iterative process and that the update of each field and source value is based, at least in part, on the previous update of each field and source value.

Once the operational simulation reaches a steady state (e.g., changes to the field values in response to the excitation source substantially stabilize or reduce to negligible values) or otherwise concludes one or more performance metrics may be determined. In one embodiment, the performance metric corresponds to the output mode of the optical device within output region 320. In the same or other embodiments, the performance metric represents power (at one or more frequencies of interest) in the target mode shape at the specific locations of the output ports within output region 320. In other embodiments, the performance metric may be representative of far field performance (e.g., for optimization of an antenna design). A loss value or metric (e.g., difference between the performance metric and a target performance metric) of the input design (e.g., the initial design and/or any refined design in which the structural parameters have been updated) may be determined. The loss value, in conjunction with an adjoint simulation, may be utilized to determine a structural gradient (e.g., influence of structural parameters on loss value) for updating or otherwise revising the structural parameters to reduce the loss value (e.g., increase performance metric to be closer to target performance metric). Additionally, the operational simulation may be utilized to determine the field gradient (e.g., the influence of the structural parameters on the field response), which is combined in the appropriate way with the loss gradient to determine the structural gradient.

FIG. 3C illustrates an example adjoint simulation within simulated environment 301-C by backpropagating a loss value, in accordance with an embodiment of the present disclosure. More specifically, the adjoint simulation is a time-backwards simulation in which a loss value is treated as an excitation source that interacts with the physical device and causes a loss response (e.g., a field response labeled to indicate a time-backwards simulation). In other words, an adjoint (or virtual) source based on the loss value is placed at the output region 320 (e.g., output ports) or other location that corresponds to a location used when determining the performance metric. The adjoint source(s) is then treated as an excitation source during the adjoint simulation. A loss response of the simulated environment 301 is computed for each of the plurality of time steps (e.g., backwards in time) in response to the adjoint source. The loss response collectively refers to loss values of the plurality of voxels that are incrementally updated in response to the adjoint source over the plurality of time steps. In some embodiments, the loss response is computed during a second physics simulation using an AI accelerator (e.g., AI accelerator 211 illustrated in FIG. 2). More specifically, the loss response may be determined in a similar manner as the field response with convolution operations from the AI accelerator utilized to perform spatial differencing. The change in loss response may correspond to a loss gradient, which is indicative of how changes in the field response or values of the physical device influence the loss value. The loss gradient and the field gradient may be combined in the appropriate way to determine the structural gradient of the physical device/simulated environment (e.g., how changes in the structural parameters of the physical device within the simulated environment influence the loss value or metric). Once the structural gradient of a particular cycle (e.g., operational and adjoint simulation) is known, the structural parameters may be updated to reduce the loss metric and generate a revised description of the physical device.

In some embodiments, iterative cycles of performing the operational simulation, performing the adjoint simulations, determining the structural gradient, and generating a revised description of the physical device by updating the structural parameters to reduce the loss value are performed successively. Specifically, as part of an inverse design technique the operations performed by the system (e.g., system 100 illustrated in FIG. 1) may include iteratively performing cycles, each cycle including successively performing the operational simulation, performing the adjoint simulation, and generating the revised description of the physical device. The cycles iteratively reduce the loss value until the loss value substantially converges such that a difference between the performance metric and the target performance metric is within a threshold range. An optimization scheme such as gradient descent may be utilized in conjunction with an AI accelerator (e.g., AI accelerator 211 illustrated in FIG. 2) to determine specific amounts or degrees of changes to the structural parameters of the physical device to incrementally reduce the loss value. More specifically, after each cycle the structural parameters are updated (e.g., optimized) to reduce the loss value. The operational simulation, adjoint simulation, and updating the structural parameters are iteratively repeated until the loss value substantially converges or is otherwise below or within a threshold value or range such that the physical device has a performance metric within a pre-determined threshold from the target performance metric.

Figure 4A:
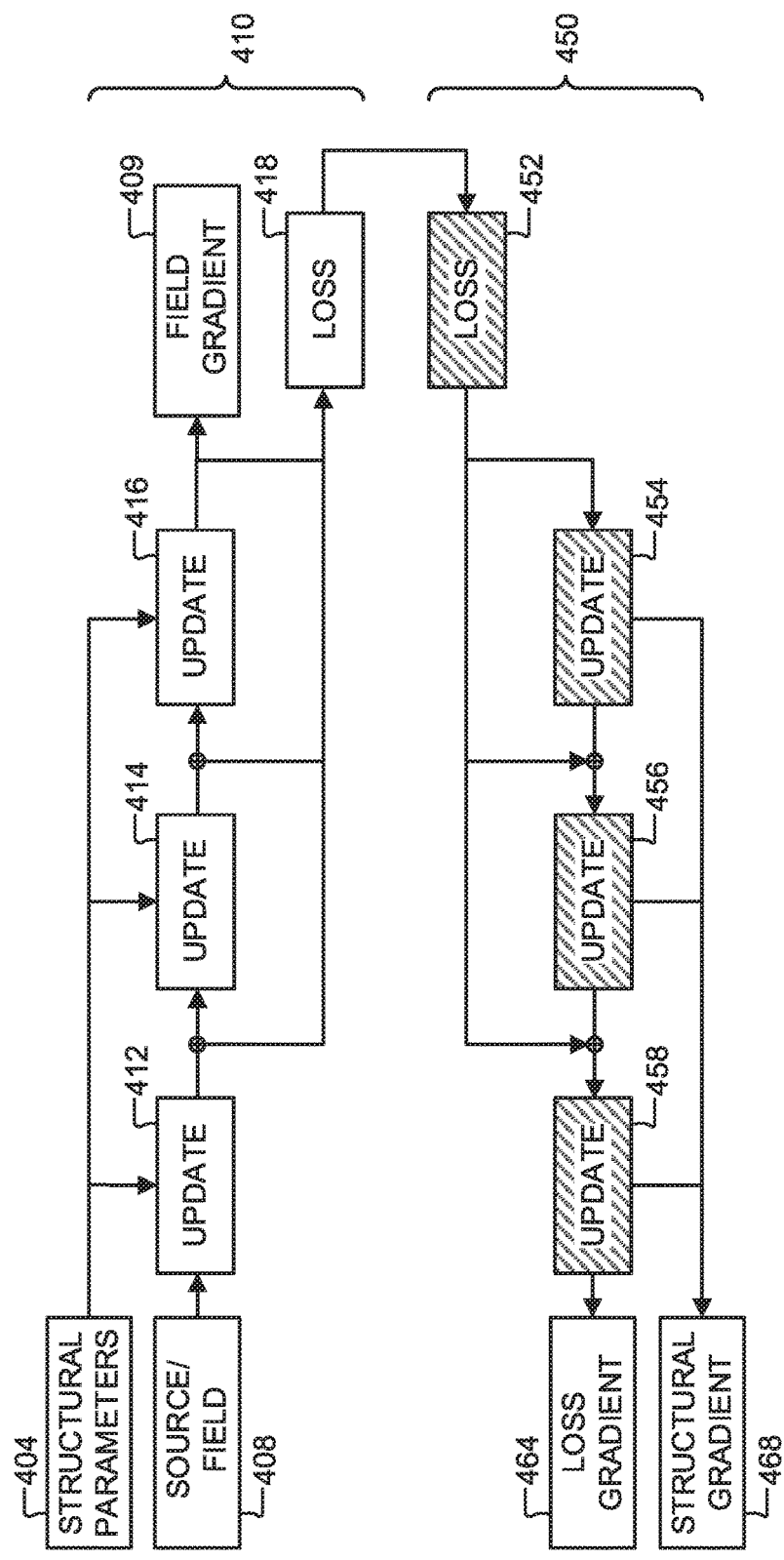
FIG. 4A is flow chart illustrating example time steps for operational and adjoint simulations, in accordance with an embodiment of the present disclosure.

FIG. 4A is a flow chart 400 illustrating example time steps for the operational simulation 410 and adjoint simulation 450, in accordance with an embodiment of the present disclosure. Flow chart 400 is one possible implementation that a system (e.g., system 100 of FIG. 1) may use to perform the operational simulation 410 and adjoint simulation 450 of the simulated environment (e.g., simulated environment 301 of FIGS. 3A-3C) describing a physical device (e.g., an optical device operating in an electromagnetic domain). In the illustrated embodiment, the operational and adjoint simulations utilizes a finite-difference time-domain (FDTD) method to model the field response (both electric and magnetic) or loss response at each of a plurality of voxels (e.g., plurality of voxels 310 illustrated in FIGS. 3A-3C) for a plurality of time steps in response to an excitation source.

As illustrated in FIG. 4A, the flow chart 400 includes update operations for a portion of operational simulation 410 and adjoint simulation 450. Operation simulation 410 occurs over a plurality of time-steps (e.g., from an initial time step to a final time step over a pre-determined or conditional number of time steps having a specified time step size) and models source and field values 408 (e.g., changes in electric and magnetic fields of a plurality of voxels describing the simulated environment and/or physical device that collective correspond to the field response). More specifically, update operations (e.g., 412, 414, and 416) are iterative and based on the field response, structural parameters 404, and an excitation source (not illustrated) to determine field gradient 409 (e.g., how changes in the structural parameters influence the field response or field values 408). Each update operation is succeeded by another update operation, which are representative of successive steps forward in time within the plurality of time steps. For example, update operation 414 updates the field values 408 based on the field response determined from the previous update operation 412 and the structural parameters 404. Similarly, update operation 416 updates the field values 408 based on the field response determined from update operation 414. In other words, at each time step of the operational simulation the field values 408 (and thus field response) is updated based on the previous field response and structural parameters of the physical device. It is noted that the field gradient 409 may be determined from the operational simulation 410 (e.g., the change in field response when transitioning from one time step or update operation to another may correspond to the field gradient 409 at a particular time step). Once the final time step of the operational simulation 410 is performed, the loss value 418 may be determined (e.g., based on a pre-determined loss function). The loss value determined from block 418 may be treated as an adjoint or virtual source (e.g., excitation source originating at an output region) to determine a loss response 452 from the final time step and backpropagating the loss value in reverse (from the final time step incrementally through the plurality of time steps until reaching the initial time step) through the simulated environment to determine the loss response at each time step, which may subsequently be used to determine loss gradient 464 and structural gradient 468.

In the illustrated embodiment, the FDTD solve (e.g., operational simulation 410) and backward solve (e.g., adjoint simulation 450) problems are described pictorially, from a high-level, using only "update" and "loss" operations as well as their corresponding gradient operations. The simulation is set up initially in which the structural parameters, excitation source, and initial field states of the simulated environment (and physical device) are provided (e.g., via an initial description and/or input design). As discussed previously, the field values are updated in response to the excitation source based on the structural parameters. More specifically, the update operation is given by $\phi$, where $x_{i+1} = \phi(x_i, \mathcal{b}_i, z)$ for $i=1, \ldots, n$. Here, n, corresponds to the total number of time steps (e.g., the plurality of time steps) for the operational simulation, where $x_i$ corresponds to the field response (the field value associated with the electric and magnetic fields of each of the plurality of voxels) of the simulated environment at time step i, $\mathcal{b}_i$ corresponds to the excitation source(s) (the source value associated with the electric and magnetic fields for each of the plurality of voxels) of the simulated environment at time step i, and z corresponds to the structural parameters describing the topology and/or material properties of the physical device (e.g., relative permittivity, index of refraction, etc. in the case of an electromagnetic device).

It is noted that using the FDTD method, the update operation may specifically be stated as:

$$\phi(x_i, \mathcal{b}_i, z) = A(z) x_i + B(z) \mathcal{b}_i. \quad (1)$$

That is to say the FDTD update is linear with respect to the field and source terms. Concretely, $A(z) \in \mathbb{R}^{N \times N}$ and $B(z) \in \mathbb{R}^{N \times N}$ are linear operators which depend on the structure parameters, z, and act on the fields, $x_i$, and the sources, $\mathcal{b}_i$, respectively. Here, it is assumed that $x_i, \mathcal{b}_i \in \mathbb{R}^N$ where N is the number of FDTD field components in the operational simulation. Additionally, the loss operation (e.g., loss function) may be given by $L = f(x_i, \ldots, x_n)$, which takes as input the computed fields and produces a single, real-valued scalar (e.g., the loss value) that can be reduced and/or minimized.

In terms of optimizing the structural parameters of the physical device, the relevant quantity to produce is dL/dz, which is used to describe the influence of changes in the structural parameters on the loss value and is denoted as the structural gradient 468 illustrated in FIG. 4A.

Figure 4B:
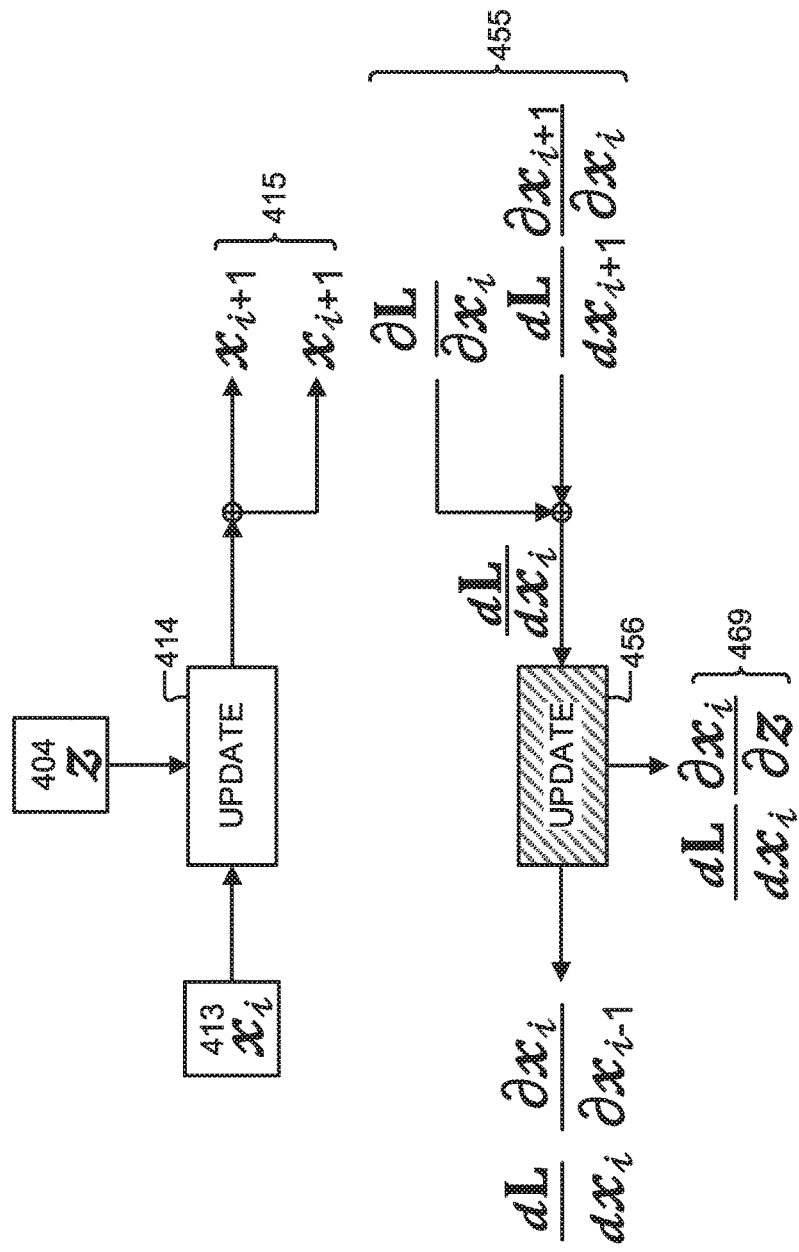
FIG. 4B is a chart illustrating a relationship between gradients determined from an operational simulation and an adjoint simulation, in accordance with an embodiment of the present disclosure.

FIG. 4B is a chart 480 illustrating the relationship between the update operation for the operational simulation and the adjoint simulation (e.g., backpropagation), in accordance with an embodiment of the present disclosure. More specifically, FIG. 4B summarizes the operational and adjoint simulation relationships that are involved in computing the structural gradient, dL/dz, which include $$\frac{\partial L}{\partial x_i}, \frac{\partial x_{i+1}}{\partial x_i}, \frac{dL}{dx_i},$$

and $$\frac{\partial x_i}{\partial z}.$$

The update operation 414 of the operational simulation updates the field values 409, $x_i$, of the plurality of voxels at the ith time step to the next time step (i.e., i+1 time step), which correspond to the field values 417, $x_{i+1}$. The gradients 453 are utilized to determine $$\frac{dL}{dx_i}$$

for the backpropagation (e.g., update operation 456 backwards in time), which combined with the gradients 469 are used, at least in part, to calculate the structural gradient, $$\frac{dL}{dz} \cdot \frac{\partial L}{\partial x_i}$$

is the contribution of each field to the loss value, L. It is noted that this is the partial derivative, and therefore does not take into account the causal relationship of $x_i \rightarrow x_{i+1}$. Thus, $$\frac{\partial x_{i+1}}{\partial x_i}$$

is utilized which encompasses the $x_i \rightarrow x_{i+1}$ relationship. The field gradient, $$\frac{dL}{dx_i}$$

may also be used to compute the structural gradient, dL/dz, and corresponds to the total derivative of the field with respect to loss value, L. The field gradient, $$\frac{dL}{dx_i},$$

at a particular time step, i, is equal to the summation of $$\frac{\partial L}{\partial x_i} + \frac{dL}{dx_{i+1}} \frac{\partial x_{i+1}}{\partial x_i}.$$

Finally, $$\frac{\partial x_i}{\partial z}$$

is used which is the contribution to dL/dz from each time/update step.

In particular, the memory footprint to directly compute $$\frac{\partial L}{\partial x_i}$$

and dL/dz is large that it is difficult to store more than a handful of state Tensors. The state Tensor corresponds to storing the values of all of the FDTD cells (e.g., the plurality of voxels) for a single simulation time step. It is appreciated that the term "tensor" may refer to tensors in a mathematical sense or as described by the TensorFlow framework developed by Google. In some embodiments the term "tensor" refers a mathematical tensor which corresponds to a multi-dimensional array that follows specific transformation laws. However, in most embodiments, the term "tensor" refers to TensorFlow tensors, in which a tensor is described as a generalization of vectors and matrices to potentially higher dimensions (e.g., n-dimensional arrays of base data types), and is not necessarily limited to specific transformation laws. For example, for the general loss function $f$, it may be necessary to store the fields, $x_i$, for all time steps, i. This is because, for most choices of $f$, the gradient will be a function of the arguments of $f$. This difficulty is compounded by the fact that the values of $$\frac{\partial L}{\partial x_i}$$

for larger values of i are needed before the values for smaller i due to the incremental updates of the field response and/or through backpropagation of the loss value, which may prevent the use of schemes that attempt to store only the values $$\frac{\partial L}{\partial x_i},$$

at an immediate time step.

An additional difficulty in performing the backpropagation (e.g., adjoint simulation) is further illustrated when computing the structural gradient, dL/dz, which is given by:

$$\frac{dL}{dz} = \sum_i \frac{dL}{dx_i} \frac{\partial x_i}{\partial z}. \tag{2}$$

For completeness, the full form of the first term in the sum, dL/dz, is expressed as:

$$\frac{dL}{dx_i} = \frac{\partial L}{\partial x_i} + \frac{dL}{dx_{i+1}} \frac{\partial x_{i+1}}{\partial x_i}. \tag{3}$$

Based on the definition of $\phi$ as described by equation (1), it is noted that $$\frac{\partial x_{i+1}}{\partial x_i} = A(z),$$

which can be substituted in equation (3) to arrive at an adjoint update for backpropagation (e.g., the update operations such as update operation 456), which can be expressed as:

$$\frac{dL}{dx_i} = \frac{\partial L}{\partial x_i} + \frac{dL}{dx_{i+1}} A(z), \tag{4}$$

or $$\nabla_{x_i} L = A(z)^T \nabla_{x_{i+1}} L + \frac{\partial L^T}{\partial x_i}. \tag{5}$$

The adjoint update is the backpropagation of the loss gradient (e.g., from the loss value) from later to earlier time steps and may be referred to as a backwards solve for $$\frac{dL}{dx_i}.$$

More specifically, the loss gradient may initially be based upon the backpropagation of a loss value determined from the operational simulation. The second term in the sum, $$\frac{dx_i}{dz},$$

corresponds to the field gradient and is denoted as:

$$\frac{\partial x_i}{\partial z} = \frac{d\phi(x_{i-1}, b_{i-1}, z)}{dz} = \frac{dA(z)}{dz} x_{i-1} + \frac{dB(z)}{dz} b_{i-1}, \tag{6}$$

for the particular form of $\phi$ described by equation (1). Thus, each term of the sum associated with dL/dz depends on both $$\frac{dL}{dx_{i_0}}$$

for $i >= i_0$ and $x_{i_0}$ for $i < i_0$. Since the dependency chains of these two terms are in opposite directions, it is concluded that computing dL/dz in this way requires the storage of $x_i$ values for all of i. In some embodiments, the need to store all field values may be mitigated by a reduced representation of the fields (e.g., via decomposition logic 147 illustrated in FIG. 1). It is appreciated that the above computations for the physics simulations (e.g., operational and adjoint simulations) may be performed by refining the operations as a series of matrix multiply or convolution operations that may be offloaded to an AI accelerator (e.g., AI accelerator 211 illustrated in FIG. 2) to enable increased simulation size, accuracy, speed, or a combination thereof.

Figure 5A:
FIGS. 5A-5B illustrate convolution operations being performed on a plurality of voxels to perform spatial differencing, in accordance with an embodiment of the present disclosure.
Figure 5B:
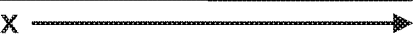

FIGS. 5A and 5B illustrate convolution operations being performed on a plurality of voxels to perform spatial differencing, in accordance with an embodiment of the present disclosure. In some embodiments, physics simulations are performed to determine the field response (e.g., of the operational simulation or adjoint simulations) to an excitation source (e.g., via an FDTD method). This is achieved by discretizing Maxwell's equations in both time and space (e.g., via a plurality of voxels within a simulated environment over a plurality of time steps) and solving for a described component (e.g., electric and/or magnetic vector components of a particular voxel at a particular time step). One particular aspect of this solution involves performing spatial differencing (e.g., central difference approximation, forward difference approximation, and backward difference approximation) to ultimately approximate a derivative (e.g., partial derivative of a particular component of the electric or magnetic field with respect to a partial derivative of space or time). The accuracy of this estimation may be based on order the spatial differencing scheme (e.g., higher order differences may be utilized to approximate higher order derivatives).

As illustrated in FIG. 5A, the field response to an excitation source within a simulated environment may be computed, at least in part, by performing one or more convolution operations to perform spatial differencing. In the illustrated embodiment, a plurality of voxels 510 form a grid, with each of the voxels representative of discretized space in the X-Y plane with respective field components ($x_i$). Spatial differencing may be performed, at least in part, by defining one or more kernels (e.g., kernel 515) of the convolution operations that result in calculating differences between field values of neighboring voxels included in the plurality of voxels 510 within the simulated environment. The convolution operations are used to approximate one or more spatial derivatives (e.g., the change electric or magnetic field vectors along the Y-axis for each of the voxels in the illustrated embodiment) for computing the field response. A convolution operation is defined as an integral of the product of two functions after one is reversed and shifted. In the illustrated embodiment, the convolution operation involves taking kernel 515 (e.g., a filter) and applying it to the simulated environment (e.g., plurality of voxels 510), which results in taking the difference in field values of neighboring voxel as illustrated in the feature map (e.g., spatial differences 520).

Advantageously, convolution operations may be performed by AI accelerators (e.g., AI accelerator 211 illustrated in FIG. 2) that a system (e.g., system 100 illustrated in FIG. 1) leverages for increased computational speed. Specifically, the convolution operation may be represented as matrix multiplication. In one embodiment, in a two-dimensional simulation space, a doubly block circulant matrix representative of the kernel 520 multiplied by a vector representative of the plurality of voxels 510 may be used to transform the convolution operation into matrix multiplication. As illustrated, the kernel (e.g., kernel 515) of the convolution operation is utilized to perform the spatial differencing. Specifically, the shape of the kernel may be defined to direct (e.g., along which axis) and the size (e.g., number of elements and value of elements) of the kernel may be defined to determine the order (e.g., accuracy) of the estimation provided by the spatial differencing. For example, the single column two row kernel, when applied to the XY plane as illustrated performs a convolution operation along the Y-axis. Thus, differences between the neighboring field values of the voxels are taken along at least one of a first dimension, a second dimension, or a third dimension (e.g., X, Y, or Z axes) that dimension a spatial dimensionality of the simulated environment (e.g., represented by one, two, or three-dimensions). In one embodiment, the first, second, and third dimensions may respectively correspond to X, Y, and Z axes. However, it is appreciated that in other embodiments the first, second, and third dimensions may be explicitly defined by a user of the system (e.g., system 100 illustrated in FIG. 1). In other words, the convolution may be taken along any one of the spatial dimensions or axes which define the spatial dimensions of the simulated environment.

In some embodiments, it may be desirable to have higher order accurate estimations of the field response by estimating the relevant derivatives by a larger number of voxels. Thus, it is appreciated that the order of spatial differencing (e.g., accuracy of estimating by approximating higher order derivatives) may be first order, second order, third order, or greater in both time and/or space. As illustrated in FIG. 5B, higher order feature maps may be determined by defining the kernel (e.g., kernel 565) such that the spatial differencing is third or higher order accurate to approximate one or more spatial derivatives. Specifically, the illustrated kernel 565 may be used when performing the convolution operation on the plurality of voxels 560 to determine higher order spatial differences 570. In the illustrated case, the spatial differences may correspond to a second order central difference approximation. However, it is appreciated that the kernel may be defined dependent on the degree of accuracy desired when approximating the relevant derivatives.

Figure 6:
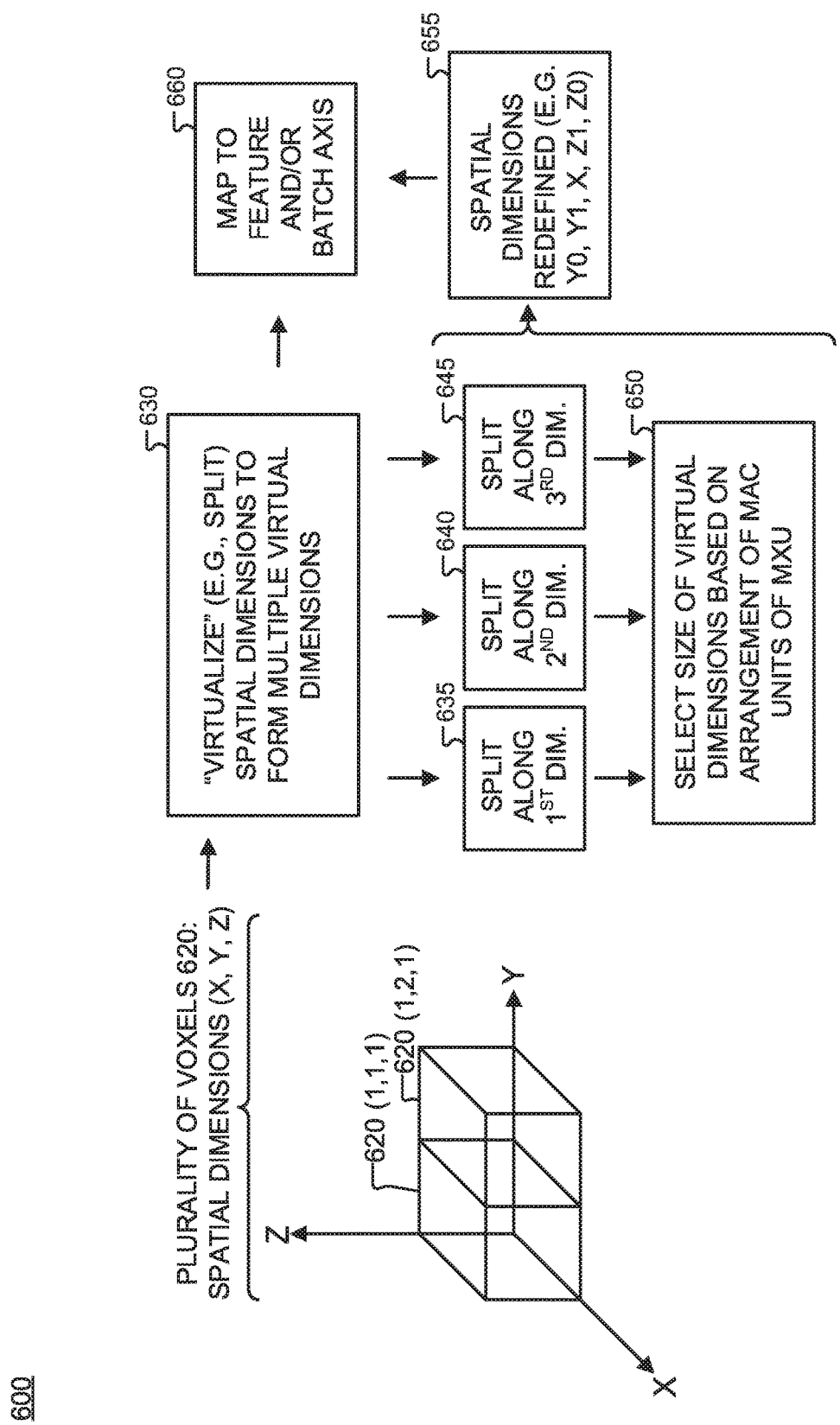
FIG. 6 illustrates a process for redefining spatial dimensions describing a plurality of voxels as multiple virtual dimensions, in accordance with an embodiment of the present disclosure.

FIG. 6 illustrates a process 600 for redefining spatial dimensions (e.g., of a simulated environment) describing a plurality of voxels 620 as multiple virtual dimensions, in accordance with an embodiment of the present disclosure. Process 600 may be implemented in a system (e.g., system 100 illustrated in FIG. 1) for performing physics simulations (e.g., to optimize a structure of a physical device). As illustrated in FIG. 6, the simulated environment has spatial dimensions along the X, Y, and Z axes and is represented by a plurality of voxels 620. However, AI accelerators (e.g., AI accelerator 211 illustrated in FIG. 2) may be optimized for parallel operations in which the convolution operation has a batch and feature axis. For example, in AI applications that batch axis corresponds to the number of images the convolution operation is being performed on while the feature axis corresponds to the number of channels (e.g., red, green, blue color channels). Thus, to leverage the computational power of machine learning accelerated hardware to perform physics simulations, the dimensions of the simulated environment are mapped or otherwise redefined to multiple "virtual dimensions" and subsequently mapped to the batch and feature axis.

Process 600 illustrates "virtualizing" (e.g., splitting) the spatial dimensions of the simulated environment, represented by plurality of voxels 620, along at least one of a first dimension, a second dimension, and/or a third dimension (e.g., X, Y, or Z dimensions) as illustrated by blocks 635, 640, and 645, respectively to form multiple virtual dimensions. Explicitly a vector, matrix, or tensor representative of the plurality of voxels 620 (e.g., field values) with a first dimensionality (e.g., three-dimensional) may be separated to generate a resultant tensor with a different dimensionality (e.g., five-dimensional). In one embodiment, the second dimension (e.g., Y dimension) is split into two virtual dimensions (e.g., Y0 and Y1) while the third dimension (e.g., Z dimension) is split into two virtual dimensions (e.g., Z0 and Z1), which results in redefined spatial dimensions of the simulated environment defined by multiple virtual dimensions as illustrated by block 655. Block 655 proceeds to block 660, which illustrates mapping (or otherwise assigning) at least one of the multiple virtual dimensions to a batch dimension (e.g., batch axis of the convolution operation) or a feature dimension (e.g., feature axis of the convolution operation).

In one embodiment a first virtual dimension included in the multiple virtual dimensions and associated with the second dimension (e.g., Y0) is mapped to the batch dimension of the convolution operations. Additionally, a second virtual dimension included in the multiple virtual dimensions and associated with the third dimension (e.g., Z0) is mapped to the feature dimension of the convolution operations. Thus, the spatial dimensions of the simulated environment may be redefined (e.g., from three-dimensional to five-dimension) to better leverage the computational power of machine learning accelerated hardware. More specifically, by redefining the spatial dimensions, chunking spatial differencing operations may be computed efficiently.

In some embodiments, the formation of the multiple virtual dimensions to redefine the spatial dimensions of the plurality of voxels may be based on the specific hardware arrangement of individual matrix multiply units (or other components) of the AI accelerator (e.g., AI accelerator 211 illustrated in FIG. 2). For example, matrix multiplication or convolution operations may be performed by a systolic array of a plurality of MAC units of an individual MXU (as described in relation to AI accelerator 211 illustrated in FIG. 2). Thus, in some embodiments, the splitting into multiple virtual dimensions is based, at least in part, on an arrangement of the plurality of MAC units of the MXU as illustrated by block 650. For example, the plurality of MAC units of an MXU (e.g., of an AI accelerator) may be arranged as at least one of N rows or M columns (e.g., an N by M array where N equals M) to perform matrix multiplication and/or convolution operations. To fully utilize each of the MAC units, a size of at least one of the virtual dimensions may be selected to be a multiple of N or M. In one embodiment, the virtual dimension mapped to the feature dimension (e.g., Z0) is a multiple of 128 (e.g., when the MAC units are arranged as a 128 by 128 array). In the same or other embodiments, the memory subsystem (e.g., buffer 214 of tensor processing unit 212 illustrated in FIG. 2 and other components such as the matrix multiply unit, a vector unit, and the like) of the AI accelerator may be configured to interface or otherwise be tied together using an 8×128 (e.g., for a 128×128 systolic array of MAC units as illustrated by matrix multiply unit 216 in FIG. 2) memory layout, such that data, instructions, or otherwise is ingested (i.e., accessed, addressed, and the like) in 8×128 chunks. Specifically, when addressing memory (e.g., to perform convolution operations) multiples of 8 and/or 128 may facilitate efficient use of the AI accelerator. Thus, in some embodiments, a size of at least one of the virtual dimensions is matched to the memory subsystem of the AI accelerator (e.g., buffer 214 illustrated in FIG. 2). In one embodiment, the virtual dimension mapped to the batch dimension (e.g., Y0) may have a size that is a multiple of 8, while the virtual dimension mapped to the feature dimension (e.g., Z0) may have a size that is a multiple of 128. Collectively, redefining the spatial dimensions of the simulated environment to map virtual dimensions to at least one of the batch or feature dimensions based on the arrangement of MAC units and/or the architecture of the memory subsystem of the AI accelerator allows for chunked spatial differencing that takes advantage of the computational power provided by the machine learning accelerated hardware platform.

Figure 7A:
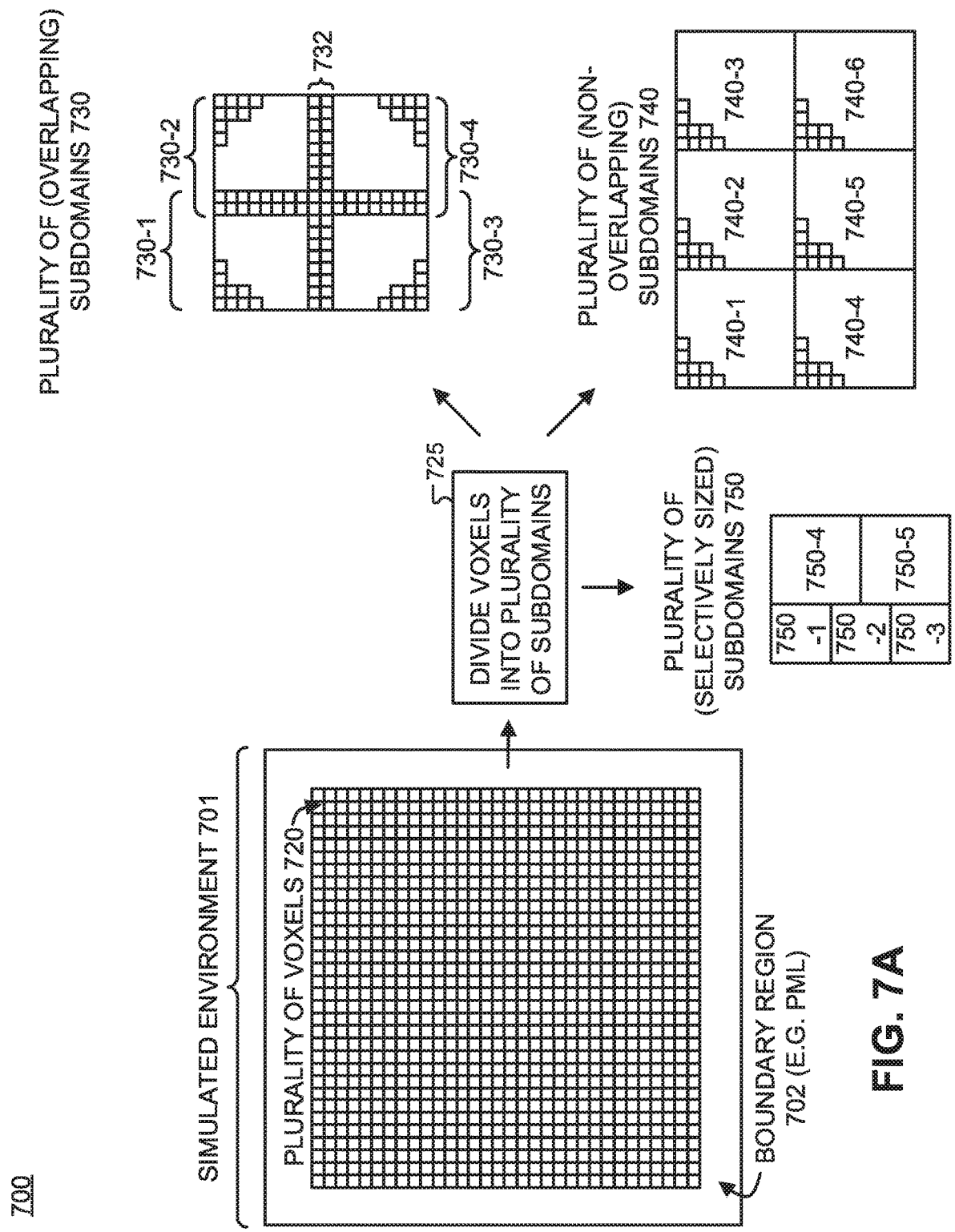
FIG. 7A illustrates a process for dividing a plurality of voxels of a simulated environment into a plurality of subdomains, in accordance with an embodiment of the present disclosure.

FIG. 7A illustrates a process for dividing a plurality of voxels of a simulated environment into a plurality of subdomains, in accordance with an embodiment of the present disclosure. Process 700 may be implemented in a system (e.g., system 100 illustrated in FIG. 1) for performing physics simulations (e.g., to optimize a structure of a physical device) with an AI accelerator (e.g., AI accelerator 211 illustrated in FIG. 2). In some embodiments, the AI accelerator may be a distributed system leveraging multiple interconnected TPUs that are each individually optimized to perform matrix multiplication and/or convolution operations (e.g., via one or more MXUs included in each of the TPUs). In some embodiments, the computational power provided by the AI accelerator potentially scales linearly with the number of TPUs (or MXUs) included in the distributed system.

As illustrated in FIG. 7A, process 700 demonstrates dividing a plurality of voxels 720 representative of simulated environment 701 into a plurality of subdomains as illustrated by block 725. More specifically, respective portions (e.g., arrays) of the plurality of voxels 720 are representative of corresponding subdomains included in the plurality of subdomains. Individual subdomains may then each be assigned to a corresponding one of a plurality of MXUs included in a distributed AI accelerator (e.g., AI accelerator 211 illustrated in FIG. 2). The plurality of subdomains are selected to (ideally) ensure the MXUs (or TPUs) of the AI accelerator are continuously active when performing the physics simulation. In other words, the simulated environment 701 is split into multiple subdomains such that when performing the physics simulations the idle time of individual MXUs or TPUs is minimized or otherwise reduced.

In one embodiment, the plurality of subdomains overlap with one another to form a plurality of overlapping subdomains 730 (e.g., 730-1, 730-2, 730-3, and 730-4). The regions where the subdomains 730 overlap are referred to as "halos." Each halo includes a portion of the plurality of voxels 720 that are included in spatially adjacent subdomains. In other words, voxels included in the halos 732 are associated with more than one subdomain. (e.g., two or more) included in the plurality of subdomains. In the same or other embodiments, the plurality of voxels 720 may be divided into a plurality of non-overlapping subdomains 740. As illustrated, non-overlapping subdomains do not have shared overlapping regions between adjacent subdomains (e.g., "halos"), but rather share a common border or interface. In another embodiment, the plurality of voxels 720 may be divided into a plurality of selectively sized subdomains 750 (e.g., 750-1, 750-2, 730-3, 750-4, and 750-5) based on a computational burden (e.g., expected or actual) of computing the field response within corresponding portions of the simulated environment 701. For example, computing the field response proximate to boundary region 702 (e.g., a perfectly matched layer to attenuate the excitation source) may be more computationally expensive than regions farther away from boundary region 702. Accordingly, the plurality of subdomains may be selectively sized to balance the computational cost of computing the field response of simulated environment 701 substantially equally (for example) among the plurality of TPUs or MXUs of the distributed AI accelerator. In the illustrated embodiment, subdomains 750-1 may be representative of a first amount of voxels 720 proximate to boundary region 702, while subdomain 750-4 is representative of a second amount of voxels 720 that is larger than the first amount and is away from boundary regions 702.

It is appreciated that by dividing the plurality of voxels 720 into a plurality of subdomains certain computations (e.g., field values) may need to be passed or otherwise communicated between MXUs or TPUs before the field values of some other subdomains may be computed. For example, neighboring field values may need to be communicated between adjacent subdomains. In one embodiment, the field values of the voxels included in subdomain 740-1 that interface with subdomain 740-2 may need to be communicated to the TPU responsible for subdomain 740-2 before the computation of the field values of the voxels included in subdomain 740-2. However, communicating field values between MXUs or TPUs of the distributed AI accelerator may introduce latency as the communication speed between TPUs may be slower relative to the computation rate of the MXUs. The communication cost may be reduced (e.g., hidden) by balancing the rate of communication with the order of computation, kernel size, and degree of overlap (e.g., size of halos) when performing the physics simulations to determine the field response.

Figure 7B:
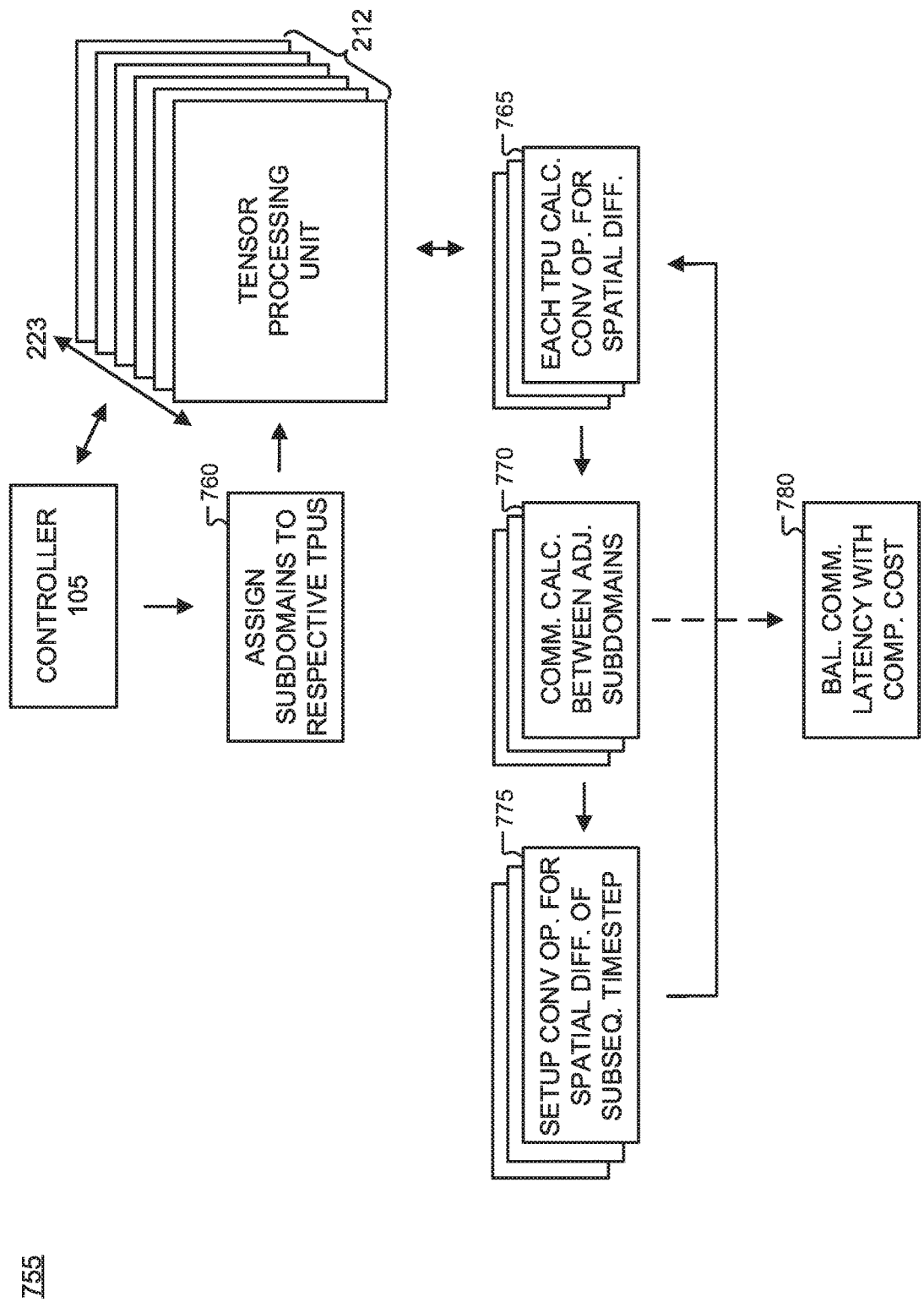
FIG. 7B illustrates a process for performing convolution operations across a plurality of tensor processing units, in accordance with an embodiment of the present disclosure.

FIG. 7B illustrates a process 755 for performing convolution operations across a plurality of tensor processing units 212 of an AI accelerator, in accordance with an embodiment of the present disclosure. Process 755 may be implemented in a system (e.g., system 100 illustrated in FIG. 1) for performing physics simulations (e.g., to optimize a structure of a physical device) with an AI accelerator (e.g., AI accelerator 211 illustrated in FIG. 2).

As illustrated in FIG. 7B, controller 105 is coupled to a plurality of TPUs 212 that are interconnected via bus 223. Block 760 illustrates controller 105 providing instructions to the plurality of TPUs 212 to assign or map a plurality of subdomains (e.g., that collectively represent a simulated environment as described in relation to FIG. 7A) to corresponding individual TPUs included in the plurality of TPUS 212 for computing a field response in response to an excitation source within the simulated environment.

Controller 105 provides instructions to the plurality of TPUs 212, which then proceed to calculate or otherwise perform convolution operations for spatial differencing to determine the field response, as illustrated in block 765. More specifically, each of the subdomains is representative of corresponding portions of the simulated environment for determining the field response when performing the physics simulation. The field response to an excitation source within a simulated environment at a particular time step may be determined at least in part, by performing spatial differencing via the convolution operations of the TPUs. However, certain subdomains may be reliant on field values from adjacent subdomains, which may necessitate communication between the TPUs to provide the needed field values for determining the field response at a particular time step. In one embodiment, the field values of a first portion of a plurality of voxels that interface with adjacent subdomains are communicated to corresponding MXUs or TPUs associated with the adjacent subdomains for computing the field response. Once the field response at a particular time step is determined, block 770 proceeds to block 775 for setting up (or otherwise configuring) the TPUs to perform convolution operations for spatial differencing at a subsequent (e.g., backwards or forwards in time) time step. This process is repeated until the field response is determined and the simulation ends (e.g., when changes in the field values reduce to negligible values, a final time step is reached, or otherwise).

It is appreciated that the latency introduced by communicating field values between voxels and the computational cost of performing the convolution operations may be balanced to (ideally) saturate the computational capabilities of the AI accelerator, as illustrated by block 780. More specifically, when communicating between TPUs, the physics simulation may be configured to balance communication latency and computational cost. In some embodiments, the rate of the communication is based, at least in part, on a degree of overlap between the plurality of subdomains. For example, larger halos (as described in FIG. 7A), may reduce the rate of communication. By using halos the size of the subdomains may be increased to allow for multiple overlapping layers, which reduces the necessity to communicate across subdomains (e.g., TPUs) for every spatial difference operation. Rather, the halos allow for communicating a larger amount of data more infrequently between TPUs, which may be balanced with the computational cost of performing the convolution operations.

In another embodiment, the communication cost or latency is hidden or otherwise reduced by adjusting the order in which the convolution operations are performed. More specifically, an order of performing the convolutions (e.g., for spatial differencing) is determined, at least in part, by communication latency between the plurality of MXUs or TPUs and a computational burden of performing the convolution operations. For example, a TPU waiting for a field value for a first subdomain or some other computational result may proceed to perform convolutions on a second subdomain that is not waiting for any field values or is otherwise not tasked with performing computations reliant on results from another MXU or TPU. This enables hiding the communication cost by keeping the MXUs or TPUs busy on non-dependent component computation. The order of performing the convolution operations is thus adjusted to maintain saturation of the MXU, for example. Accordingly, in some embodiments, a first MXU or TPU may be tasked with performing a number of convolution operations, a portion of which may be reliant on computations from a different MXU or TPU. The portion of operations may be performed interspersed between the other operations which are non-dependent on information or results from other MXUs or TPUs such that the first MXU or TPU remains substantially saturated in performing calculations.

In the same or other embodiments, the communication cost is hidden or otherwise reduced by using larger spatial differencing kernels. In other words, the size of the kernel used for the convolution operation may be tied to the rate field values are communicated between TPUs. For example, the spatial differencing results in calculating differences between field values of the plurality of voxels within a subdomain by using convolution operations of an AI accelerator. The differences may be based on a specified number (e.g., "N") of voxels along a dimension or axis, which is determined by a size of the kernel used in the convolution operation. Thus, by adjusting a size of the kernel to use a larger value for N, the rate of communication may be reduced to offset the cost of subdomain communication.

Figure 8:
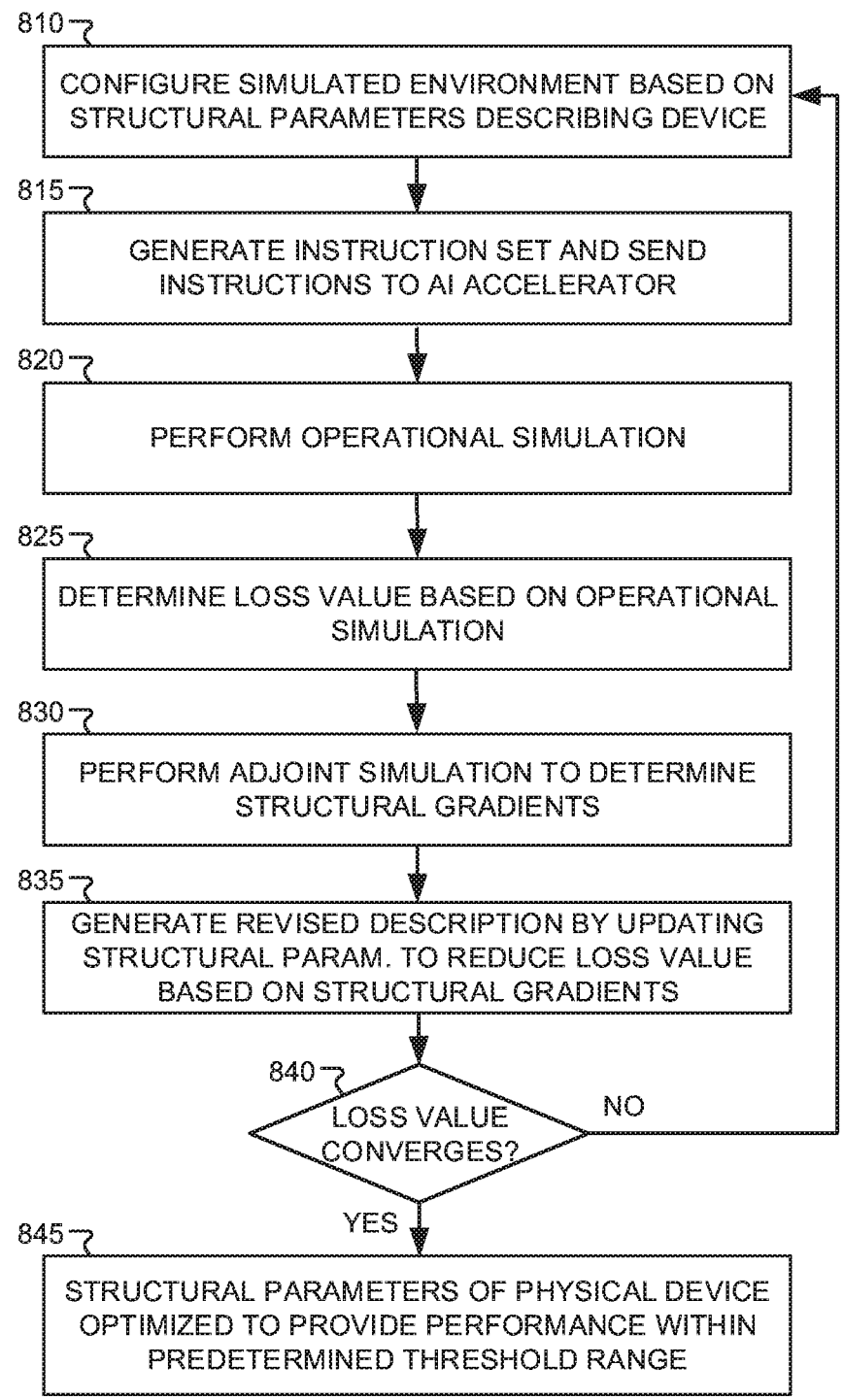
FIG. 8 illustrates a process for optimizing structural parameters of a physical device, in accordance with an embodiment of the present disclosure.

FIG. 8 illustrates a process 800 for optimizing structural parameters of a physical device, in accordance with an embodiment of the present disclosure. The order in which some or all of the process blocks appear in process 800 should not be deemed limiting. Rather, one of ordinary skill in the art having the benefit of the present disclosure will understand that some of the process blocks may be executed in a variety of orders not illustrated, or even in parallel.

Block 810 illustrates receiving (or otherwise obtaining) an initial description of a physical device (e.g., an optical device operating in the electromagnetic domain). The initial description may describe structural parameters of the physical device within a simulated environment. The simulated environment may include a plurality of voxels that collectively describe the structural parameters of the physical device. Each of the plurality of voxels is associated with a structural value to describe the structural parameters, a field value to describe the field response (e.g., the electric and magnetic fields in one or more orthogonal directions), and a source value to describe the excitation source. Once receiving or obtaining the initial description, the simulated environment is configured (e.g., the number of voxels, shape/arrangement of voxels, and specific values for the structural value, field value, and/or source value of the voxels are set based on the initial description). In some embodiments the initial description may be a first description of the physical device in which values for the structural parameters may be random values or null values outside of input and output regions such that there is no bias for the initial (e.g., first) design. It is appreciated that the initial description or input design may be a relative term. Thus, in some embodiments an initial description may be a first description of the physical device described within the context of the simulated environment (e.g., a first input design for performing a first operational simulation). However, in other embodiments, the term initial description may refer to an initial description of a particular cycle (e.g., of performing an operational simulation, operating an adjoint simulation, and updating the structural parameters). In such an embodiment, the initial description or design of that particular cycle may correspond to a revised description or refined design (e.g., generated from a previous cycle). In one embodiment, the simulated environment includes a design region that includes a portion of the plurality of voxels which have structural parameters that may be updated, revised, or otherwise changed to optimize the structural parameters of the physical device. In the same or other embodiments, the structural parameters are associated with geometric boundaries and/or material compositions of the physical device based on the material properties (e.g., relative permittivity, index of refraction, etc.) of the simulated environment.

Block 815 shows generating an instruction set and sending said instruction set to an AI accelerator for performing physics simulations via convolution operations. The instruction set may be based on a particular machine learning framework (e.g., TensorFlow), which is subsequently translated to an instruction set readable by the TPU (e.g., a high level instruction set native to the TPU).

Block 520 illustrates performing an operational simulation of the physical device within the simulated environment. More specifically, a field response to an excitation source within the simulated environment is determined. The field response is updated incrementally over a plurality of time steps to determine how the excitation source (e.g., electromagnetic wave) stimuli and the physical device interact (e.g., how the field response of the physical device changes due to the excitation source). The field values of the plurality of voxels are updated in response to the excitation source and based, at least in part, on the structural parameters of the physical device. Additionally, each update operation at a particular time step may also be based, at least in part, on a previous (e.g., immediately prior) time step. Changes in the field values within the simulated environment in response to the excitation source may be determined by an AI accelerator using convolution operations for spatial differencing. Thus, based on the changes in the field values, a field gradient describing how changes in the structure influence changes in the field may be determined, in accordance with embodiments of the present disclosure.

Block 825 shows determining a loss value based on the operational simulation. The loss value may be based on a loss function which correlates a target performance metric and a (simulated) performance metric. In some embodiments, the loss value is based, at least in part, on a difference between the performance metric (e.g., power or mode at an output port) and a target performance metric.

Block 830 shows performing an adjoint simulation by backpropagating the loss value through the simulated environment to determine an influence of changes in the structural parameters on the loss value (i.e., structural gradient). More specifically, the adjoint simulation is utilized to determine a loss gradient, which is combined with a field gradient determined from the operational simulation to determine the structural gradient. The loss value is treated as an adjoint or virtual source and is backpropagated incrementally from a final time step to earlier time steps in a backwards simulation to determine how changes in the field response influence the loss value (i.e., loss gradient). Once the loss gradient is known and the field gradient is known based on the field response with respect to time from the operational simulation, the two gradients may be combined in the appropriate way to determine the structural gradient, which indicates how changes in the structure influence the loss value.

Block 835 illustrates generating a revised description of the physical device by updating the structural parameters to reduce the loss value (e.g., based on the structural gradient). In some embodiments, an optimization scheme such as gradient descent is utilized to determine how to explicitly adjust the structural parameters. The specific route for optimization is dependent on the optimization algorithm (e.g., gradient descent).

Block 840 shows determining whether the loss value substantially converges such that the difference between the performance metric and the target performance metric is within a threshold range. In some embodiments, the term "converges" may simply indicate the difference is within the threshold range and/or below some threshold value. Iterative cycles of successively performing the operational simulation, backpropagating the loss value (e.g., adjoint simulation), adjusting or otherwise updating the structural parameters (e.g., optimization) to reduce the loss value are repeatedly performed (e.g., block 840 proceeds to block 810) until the loss value is reduced to be within the threshold range and block 840 proceeds to block 845.

Block 845 shows outputting a revised design or description of the physical device in which the structural parameters produce a device with an expected performance metric within a threshold range of a target performance metric. Upon completion of performing the operational simulation, performing the adjoint simulation, and updating the structural parameters, the loss value is iteratively reduced until the loss value substantially converges within the threshold range. An optimized design of the physical device is subsequently generated upon completion of the cycles.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC") or otherwise.

A tangible machine-readable storage medium includes any mechanism that provides (i.e., stores) information in a non-transitory form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. At least one non-transitory machine-accessible storage medium that provides instructions that, when executed by a machine, will cause the machine to perform operations comprising:
    configuring a simulated environment to be representative of a physical device based, at least in part, on an initial description of the physical device that describes structural parameters of the physical device;
    performing a physics simulation using an artificial intelligence ("AI") accelerator, wherein the AI accelerator includes a matrix multiply unit for computing convolution operations via a plurality of multiply-accumulate ("MAC") units; and
    computing a field response of the physical device in response to an excitation source within the simulated environment when performing the physics simulation, wherein the field response is computed, at least in part, with the convolution operations to perform spatial differencing.

2. The at least one non-transitory machine-accessible storage medium of claim 1, which provides additional instructions that, when executed by the machine, will cause the machine to perform further operations comprising:
    computing a loss metric based, at least in part, on a comparison between a performance metric of the physical device determined from the field response and a target performance metric;
    performing a second physics simulation of the physical device using the AI accelerator to compute a loss response of the physical device to an adjoint source for determining an influence of changes in the structural parameters on the loss metric, and wherein the loss response is determined, at least in part, with the convolution operations to perform the spatial differencing; and
    generating a revised description of the physical device by updating the structural parameters to reduce the loss metric.

3. The at least one non-transitory machine-accessible storage medium of claim 2, which provides additional instructions that, when executed by the machine, will cause the machine to perform further operations comprising:
    iteratively performing cycles with the AI accelerator, each of the cycles including successively performing the physics simulation, performing the second physics simulation, and generating the revised description of the physical device, wherein the cycles iteratively reduce the loss metric until the loss metric substantially converges such that a difference between the performance metric and the target performance metric is within a threshold range.

4. The at least one non-transitory machine-accessible storage medium of claim 1, wherein the physical device is described by a plurality of voxels within the simulated environment, wherein the spatial differencing is performed, in part, by defining one or more kernels of the convolution operations that results in calculating differences between field values of neighboring voxels included in the plurality of voxels to approximate one or more spatial derivatives for computing the field response.

5. The at least one non-transitory machine-accessible storage medium of claim 4, wherein the differences between the field values of the neighboring voxels are taken along at least one of a first dimension, a second dimension, or a third dimension, wherein spatial dimensionality of the physical device is one-dimensional, two-dimensional, or three-dimensional, and wherein the spatial dimensionality is defined by at least one of the first dimension, the second dimension, or the third dimension.

6. The at least one non-transitory machine-accessible storage medium of claim 5, which provides additional instructions that, when executed by the machine, will cause the machine to perform further operations comprising:
    splitting at least one of the first dimension, the second dimension, or the third dimension into multiple virtual dimensions to describe the physical device with the spatial dimensionality redefined for performing the convolution operations with the AI accelerator; and
    mapping at least one of the multiple virtual dimensions to a batch dimension or feature dimension of the convolution operations.

7. The at least one non-transitory machine-accessible storage medium of claim 6, wherein a first virtual dimension, included in the multiple virtual dimensions, associated with the second dimension is mapped to the batch dimension of the convolution operations, and wherein a second virtual dimension, included in the multiple virtual dimensions, associated with third dimension is mapped to the feature dimension of the convolution operations.

8. The at least one non-transitory machine-accessible storage medium of claim 6, wherein the splitting into the multiple virtual dimensions is based, at least in part, on an arrangement of the plurality of MAC units of the matrix multiply unit.

9. The at least one non-transitory machine-accessible storage medium of claim 6, wherein a size of at least one of the multiple virtual dimensions is matched to a memory subsystem of the AI accelerator.

10. The at least one non-transitory machine-accessible storage medium of claim 4, wherein at least one of the one or more kernels is defined such that the spatial differencing is third or higher order accurate to approximate the one or more spatial derivatives.

11. The at least one non-transitory machine-accessible storage medium of claim 1, which provides additional instructions that, when executed by the machine, will cause the machine to perform further operations comprising:
    dividing the simulated environment including the physical device into a plurality of subdomains, wherein the matrix multiply unit (MXU) is a first MXU included in a plurality of MXUs that are interconnected such that the AI accelerator is a distributed system, and wherein each of the plurality of subdomains are respectively assigned to a corresponding one of the plurality of MXUs.

12. The at least one non-transitory machine-accessible storage medium of claim 11, wherein the physical device is described by a plurality of voxels within the simulated environment, wherein the plurality of voxels is associated with field values that collectively represent the field response of the physical device, wherein each of the plurality of subdomains includes a respective portion of the plurality of voxels, and wherein the at least one non-transitory machine-accessible storage medium provides additional instructions that, when executed by the machine, will cause the machine to perform further operations comprising:
communicating the field values of a first portion of the plurality of voxels that interface with adjacent subdomains to corresponding MXUs included in the plurality of MXUs associated with the adjacent subdomains for computing the field response of the physical device.

13. The at least one non-transitory machine-accessible storage medium of claim 12, wherein the plurality of subdomains overlap one another such that a second portion of the plurality of voxels is included in two or more subdomains included in the plurality of subdomains.

14. The at least one non-transitory machine-accessible storage medium of claim 12, wherein a rate of the communicating is based, at least in part, on a degree of overlap between the plurality of subdomains.

15. The at least one non-transitory machine-accessible storage medium of claim 12, wherein the spatial differencing is performed, in part, by defining one or more kernels of the convolution operations that results in calculating differences between the field values of the plurality of voxels describing the physical device within the simulated environment to approximate one or more spatial derivatives for computing the field response of the physical device, wherein each of the differences calculated are based on the field values of N voxels included in the plurality of voxels, and wherein a rate of the communicating is based, at least in part, on N, which is defined by the one or more kernels.

16. The at least one non-transitory machine-accessible storage medium of claim 11, which provides additional instructions that, when executed by the machine, will cause the machine to perform further operations comprising:
performing the spatial differencing on the plurality of subdomains via the convolution operations, wherein an order of performing the convolution operations is determined, at least in part, by communication latency between the plurality of MXUs and a computational burden of performing the convolution operations.

17. The at least one non-transitory machine-accessible storage medium of claim 11, wherein the physical device is described by a plurality of voxels within the simulated environment, wherein the plurality of voxels are associated with field values that collectively represent the field response, wherein each of the plurality of subdomains includes a respective portion of the plurality of voxels, and wherein the at least one non-transitory machine-accessible storage medium provides additional instructions that, when executed by the machine, will cause the machine to perform further operations comprising:
selectively sizing individual subdomains included in the plurality of subdomains based on a computational burden of computing the field response of the physical device within corresponding portions of the simulated environment.

18. A system for performing a physics simulation, the system comprising:
a distributed artificial intelligence ("AI") accelerator including a plurality of matrix multiply units ("MXU") coupled to one another, wherein each of the plurality of MXUs includes a plurality of multiply-accumulate ("MAC") units for computing convolution operations; and
a controller including one or more processors coupled to the distributed AI accelerator and memory, wherein the memory stores instructions that when executed by the one or more processors cause the system to perform operations including:
configuring a simulated environment to be representative of a physical device based, at least in part, on an initial description of the physical device that describes structural parameters of the physical device;
computing a field response in response to an excitation source within a simulated environment when performing a physics simulation using the distributed AI accelerator, wherein the field response is computed, at least in part, with the convolution operations to perform spatial differencing.

19. The system of claim 18, wherein the memory stores additional instructions that when executed by the one or more processors cause the system to perform further operations including:
computing a loss metric based, at least in part, on a comparison between a performance metric of the physical device determined from the field response and a target performance metric;
performing a second physics simulation of the physical device using the distributed AI accelerator to compute a loss response of the physical device to an adjoint source for determining an influence of changes in the structural parameters on the loss metric, and wherein the loss response is determined, at least in part, with the convolution operations to perform the spatial differencing; and
generating a revised description of the physical device by updating the structural parameters to reduce the loss metric.

20. The system of claim 19, wherein the memory stores additional instructions that when executed by the one or more processors cause the system to perform further operations including:
iteratively performing cycles with the distributed AI accelerator, each of the cycles including successively performing the physics simulation, performing the second physics simulation, and generating the revised description of the physical device, wherein the cycles iteratively reduce the loss metric until the loss metric substantially converges such that a difference between the performance metric and the target performance metric is within a threshold range.

21. The system of claim 18, wherein the physical device is described by a plurality of voxels within the simulated environment, wherein the spatial differencing is performed, in part, by defining one or more kernels of the convolution operations that results in calculating differences between field values of neighboring voxels included in the plurality of voxels to approximate one or more spatial derivatives for computing the field response.

22. The system of claim 21, wherein the differences between the field values of the neighboring voxels are taken along at least one of a first dimension, a second dimension, or a third dimension, wherein spatial dimensionality of the physical device is one-dimensional, two-dimensional, or three-dimensional, and wherein the spatial dimensionality is defined by at least one of the first dimension, the second dimension, or the third dimension.

23. The system of claim 22, wherein the memory stores additional instructions that when executed by the one or more processors cause the system to perform further operations including:

splitting at least one of the first dimension, the second dimension, or the third dimension into multiple virtual dimensions to describe the physical device with the spatial dimensionality redefined for performing the convolution operations with the distributed AI accelerator; and mapping at least one of the multiple virtual dimensions to a batch dimension or feature dimension of the convolution operations.

24. The system of claim 23, wherein the splitting into the multiple virtual dimensions is based, at least in part, on an arrangement of the plurality of MAC units of at least one of the plurality of MXUs.

25. The system of claim 23, wherein a size of at least one of the multiple virtual dimensions is matched to a memory subsystem of the distributed AI accelerator.

26. The system of claim 18, wherein the memory stores additional instructions that when executed by the one or more processors cause the system to perform further operations including:

dividing the simulated environment into a plurality of subdomains, each associated with a respective one of the plurality of MAC units of the distributed AI accelerator for distributing computation of the field response across the plurality of MXUs of the distributed AI accelerator.

27. The system of claim 26, wherein the physical device is described by a plurality of voxels within the simulated environment, wherein the plurality of voxels is associated with field values that collectively represent the field response, wherein each of the plurality of subdomains includes a respective portion of the plurality of voxels, and wherein the memory stores additional instructions that when executed by the one or more processors cause the system to perform further operations including:

communicating the field values of a first portion of the plurality of voxels that interface with adjacent subdomains to corresponding MXUs included in the plurality of MXUs associated with the adjacent subdomains for computing the field response.

28. The system of claim 27, wherein the plurality of subdomains overlap one another such that a second portion of the plurality of voxels is included in two or more subdomains included in the plurality of subdomains.

29. The system of claim of claim 28, wherein a rate of the communicating is based, at least in part, on a degree of overlap between the plurality of subdomains.

30. The system of claim 27, wherein the spatial differencing is performed, in part, by defining one or more kernels of the convolution operations that results in calculating differences between the field values of the plurality of voxels describing the physical device within the simulated environment to approximate one or more spatial derivatives for computing the field response of the physical device, wherein each of the differences calculated are based on the field values of N voxels included in the plurality of voxels, and wherein a rate of the communicating is based, at least in part, on N, which is defined by the one or more kernels.

31. The system of claim of claim 26, wherein the memory stores additional instructions that when executed by the one or more processors cause the system to perform further operations including:

performing the spatial differencing on the plurality of subdomains via the convolution operations, wherein an order of performing the convolution operations is determined, at least in part, by communication latency between the plurality of MXUs and a computational burden of performing the convolution operations.

32. The system of claim 26, wherein the physical device is described by a plurality of voxels within the simulated environment, wherein the plurality of voxels are associated with field values that collectively represent the field response, wherein each of the plurality of subdomains includes a respective portion of the plurality of voxels, wherein the memory stores additional instructions that when executed by the one or more processors cause the system to perform further operations including:

selectively sizing individual subdomains included in the plurality of subdomains based on a computational burden of computing the field response of the physical device within corresponding portions of the simulated environment.

33. At least one non-transitory machine-accessible storage medium that provides instructions that, when executed by a machine, will cause the machine to perform operations comprising:

performing a physics simulation using an artificial intelligence ("AI") accelerator, wherein the AI accelerator includes a matrix multiply unit for computing convolution operations via a plurality of multiply-accumulate ("MAC") units; and computing a field response in response to an excitation source within a simulated environment when performing the physics simulation, wherein the field response is computed, at least in part, with the convolution operations to perform spatial differencing.

34. The at least one non-transitory machine-accessible storage medium of claim 33, which provides additional instructions that, when executed by the machine, will cause the machine to perform further operations comprising:

performing an operational simulation of a physical device described by structural parameters within the simulated environment, wherein the operational simulation is performed with the physics simulation to compute the field response for determining a performance metric of the physical device;

determining a loss metric based, at least in part, on a comparison between the performance metric of the physical device and a target performance metric;

performing an adjoint simulation by performing a second physics simulation with the loss value as an adjoint source;

computing a loss response in response to the adjoint source within the simulated environment to determine a loss gradient when performing the adjoint simulation, wherein the loss response is computed, at least in part, with the convolution operations to perform the spatial differencing;

computing a structural gradient based, at least in part, on the loss gradient, wherein the structural gradient corresponds to an influence of changes in the structural parameters on the loss metric; and generating a revised description of the physical device by updating the structural parameters based on the structural gradient to reduce the loss metric.

35. The at least one non-transitory machine-accessible storage medium of claim 34, which provides additional instructions that, when executed by the machine, will cause the machine to perform further operations comprising:

iteratively performing cycles, each of the cycles including successively performing the operational simulation, performing the adjoint simulation, and generating the revised description of the physical device, wherein the cycles iteratively reduce the loss metric until the loss metric substantially converges such that a difference between the performance metric and the target performance metric is within a threshold range.

* * * * *